(12) United States Patent
Morifuji et al.

(10) Patent No.: US 8,883,566 B2
(45) Date of Patent: Nov. 11, 2014

(54) METHOD OF MANUFACTURING SEMICONDUCTOR DEVICE, SEMICONDUCTOR DEVICE AND MULTILAYER WAFER STRUCTURE

(71) Applicants: Rohm Co., Ltd., Kyoto (JP); Renesas Electronics Corporation, Kanagawa (JP)

(72) Inventors: Tadahiro Morifuji, Kyoto (JP); Haruo Shimamoto, Kanagawa (JP); Chuichi Miyazaki, Kanagawa (JP); Toshihide Uematsu, Kanagawa (JP); Yoshiyuki Abe, Kanagawa (JP)

(73) Assignees: Rohm Co., Ltd., Kyoto (JP); Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/248,400

(22) Filed: Apr. 9, 2014

(65) Prior Publication Data

US 2014/0220740 A1 Aug. 7, 2014

Related U.S. Application Data

(62) Division of application No. 12/872,966, filed on Aug. 31, 2010, now Pat. No. 8,729,698.

(30) Foreign Application Priority Data

Sep. 28, 2009 (JP) ................................ 2009-223266

(51) Int. Cl.
*H01L 23/00* (2006.01)
*H01L 21/78* (2006.01)
(Continued)

(52) U.S. Cl.
CPC ....... *H01L 24/97* (2013.01); *H01L 2924/01006* (2013.01); *H01L 24/16* (2013.01); *H01L*
(Continued)

(58) Field of Classification Search
None
See application file for complete search history.

(56) References Cited

U.S. PATENT DOCUMENTS 7,911,045 B2    3/2011    Matsushima et al.
8,637,350 B2 *  1/2014    Ahn et al. .................... 438/109
(Continued)

FOREIGN PATENT DOCUMENTS

JP    2001-085363 A    3/2001
JP    2003-142648 A    5/2003
(Continued)

*Primary Examiner* — Seahvosh Nikmanesh
(74) *Attorney, Agent, or Firm* — Rabin & Berdo, P.C.

(57) ABSTRACT

Grooves are formed on the front surfaces of first and second semiconductor wafers each including an aggregate of a plurality of semiconductor chips. The grooves each extend on a dicing line set between the semiconductor chips and to have a larger width than the dicing line. Thereafter the first and second semiconductor wafers are arranged so that the front surfaces thereof are opposed to each other, and the space between the first semiconductor wafer and the second semiconductor wafer is sealed with underfill. Thereafter the rear surfaces of the first and second semiconductor wafers are polished until at least the grooves are exposed, and a structure including the first and second semiconductor wafers and the underfill is cut on the dicing line.

5 Claims, 33 Drawing Sheets

(51) Int. Cl.
  *H01L 23/31*    (2006.01)
  *H01L 25/00*    (2006.01)
  *H01L 21/768*   (2006.01)
  *H01L 21/56*    (2006.01)
  *H01L 21/683*   (2006.01)

(52) U.S. Cl.
  CPC ...... 2225/06513 (2013.01); *H01L 2225/06582* (2013.01); *H01L 2924/01033* (2013.01); *H01L 2924/01078* (2013.01); *H01L 21/78* (2013.01); *H01L 2225/06541* (2013.01); *H01L 2221/68327* (2013.01); *H01L 21/6836* (2013.01); *H01L 2924/01074* (2013.01); *H01L 24/94* (2013.01); *H01L 24/13* (2013.01); *H01L 23/3128* (2013.01); *H01L 2224/16145* (2013.01); *H01L 2224/13147* (2013.01); *H01L 21/6835* (2013.01); *H01L 2924/15311* (2013.01); *H01L 25/50* (2013.01); *H01L 2924/01019* (2013.01); *H01L 2924/01079* (2013.01); *H01L 2224/13144* (2013.01); *H01L 2224/81801* (2013.01); *H01L 2924/01029* (2013.01); *H01L 2224/95143* (2013.01); *H01L 24/17* (2013.01); *H01L 2924/10253* (2013.01); *H01L 2924/01015* (2013.01); *H01L 24/81* (2013.01); *H01L 21/76898* (2013.01); *H01L 2224/13025* (2013.01); *H01L 2924/3011* (2013.01); *H01L 2224/81193* (2013.01); *H01L 21/561* (2013.01); *H01L 2924/01013* (2013.01); *H01L 2224/9202* (2013.01); *H01L 2924/014* (2013.01); *H01L 2224/13155* (2013.01)
  USPC ........................................................ 438/113

(56)  References Cited

U.S. PATENT DOCUMENTS

| 8,729,698 | B2 * | 5/2014 | Morifuji et al. ............... 257/737 |
| 2003/0080410 | A1 | 5/2003 | Shibata |
| 2005/0250310 | A1 | 11/2005 | Ogawa |
| 2006/0267188 | A1 | 11/2006 | Ishino et al. |
| 2008/0164575 | A1 | 7/2008 | Ikeda et al. |
| 2008/0230898 | A1 | 9/2008 | Meguro et al. |
| 2009/0218671 | A1 | 9/2009 | Kuwabara |
| 2009/0321956 | A1 | 12/2009 | Sasaki et al. |

FOREIGN PATENT DOCUMENTS

| JP | 2005-166807 | A | 6/2005 |
| JP | 2006-319243 | A | 11/2006 |
| JP | 2008-153326 | A | 7/2008 |
| JP | 2008-235401 | A | 10/2008 |
| JP | 2010-016374 | A | 1/2010 |

* cited by examiner

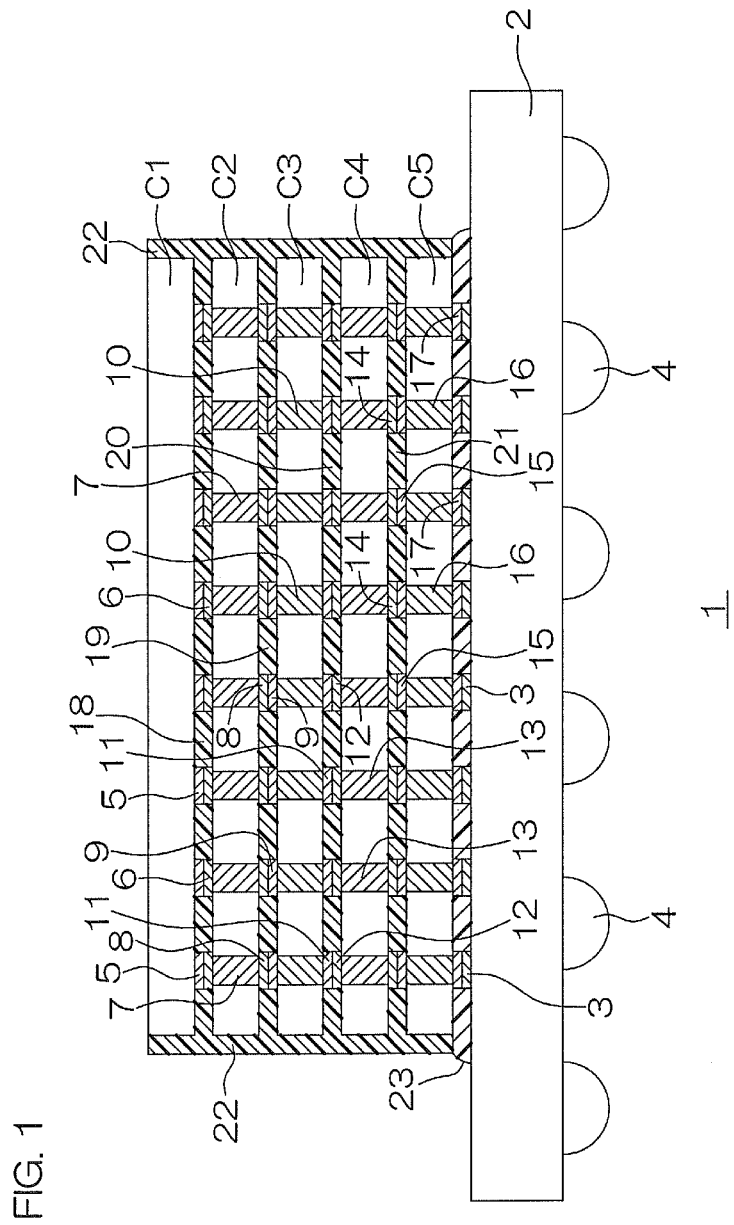

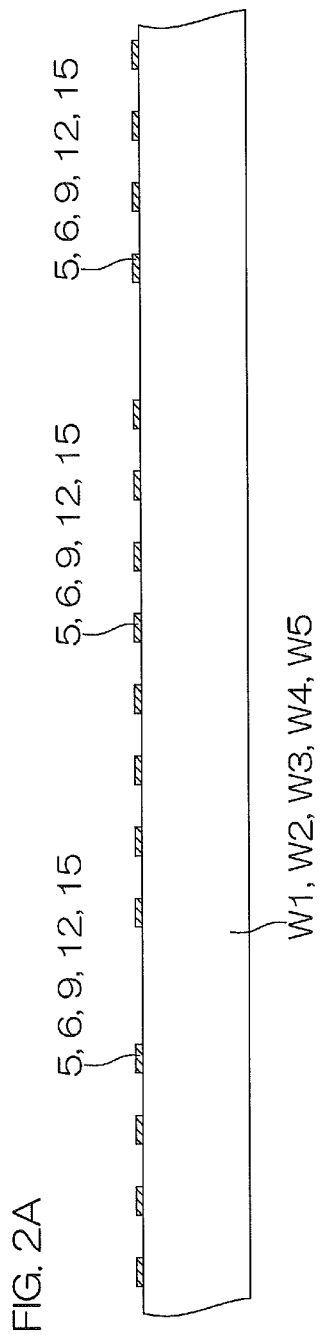

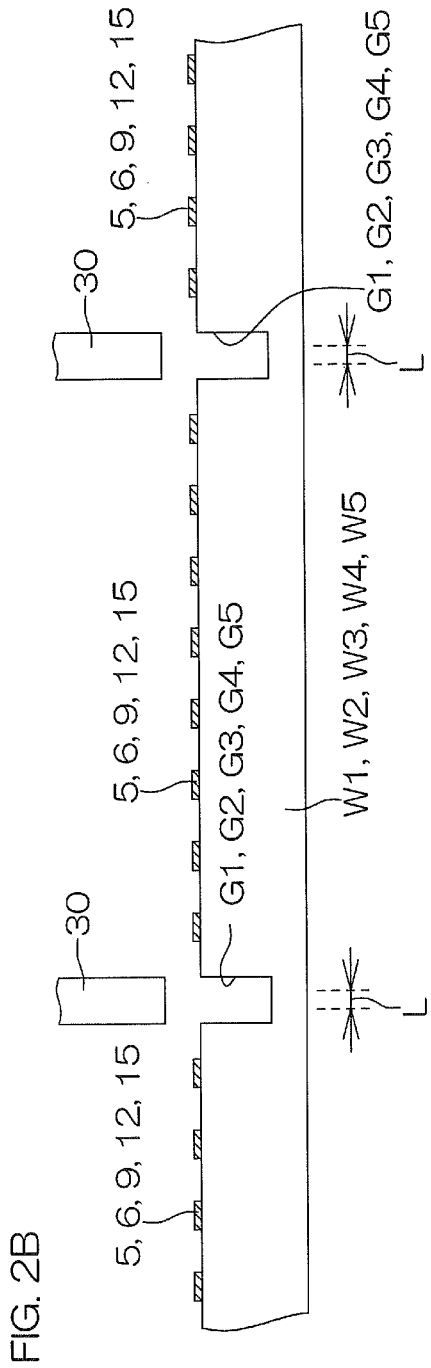

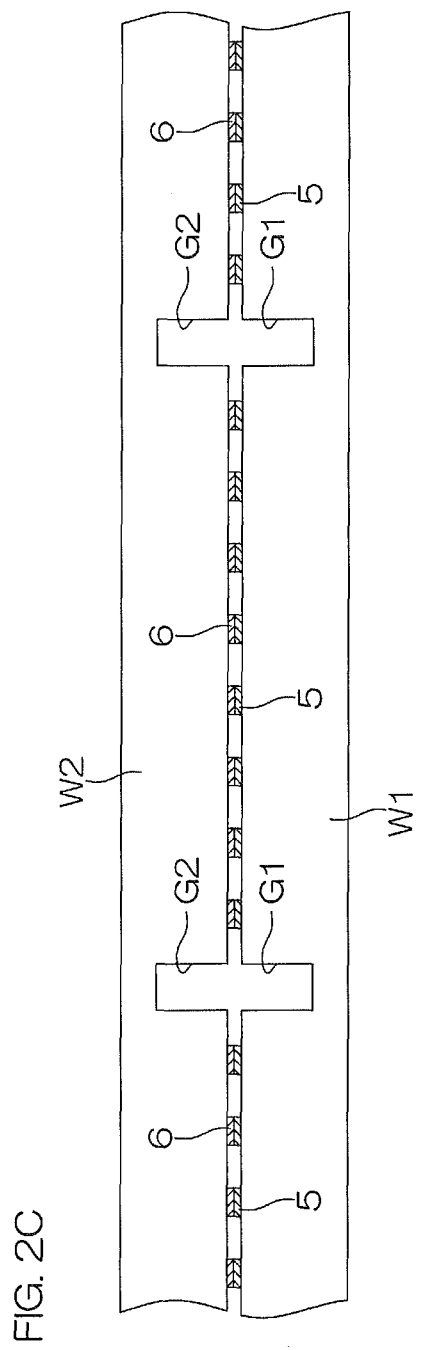

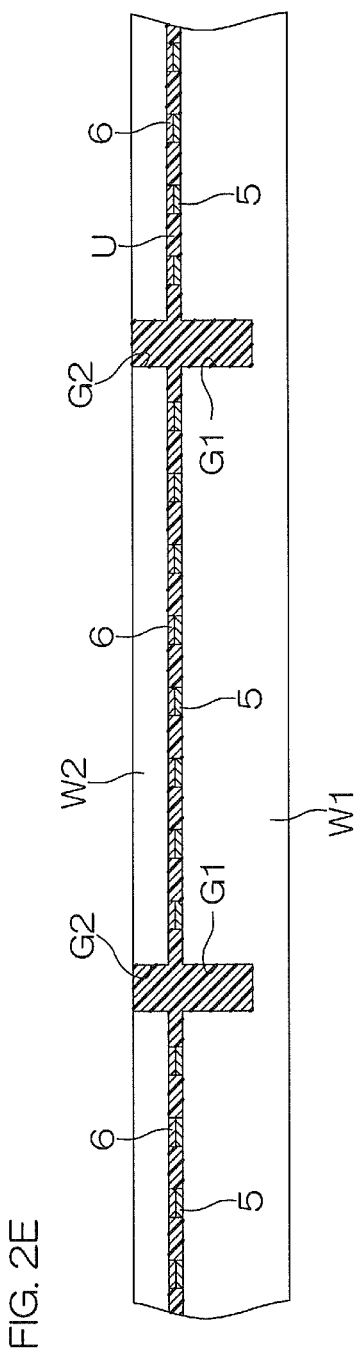

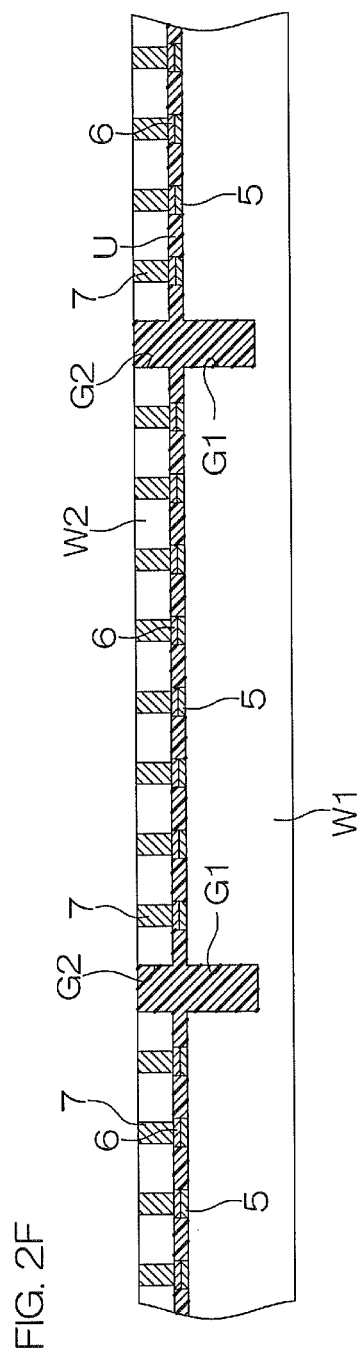

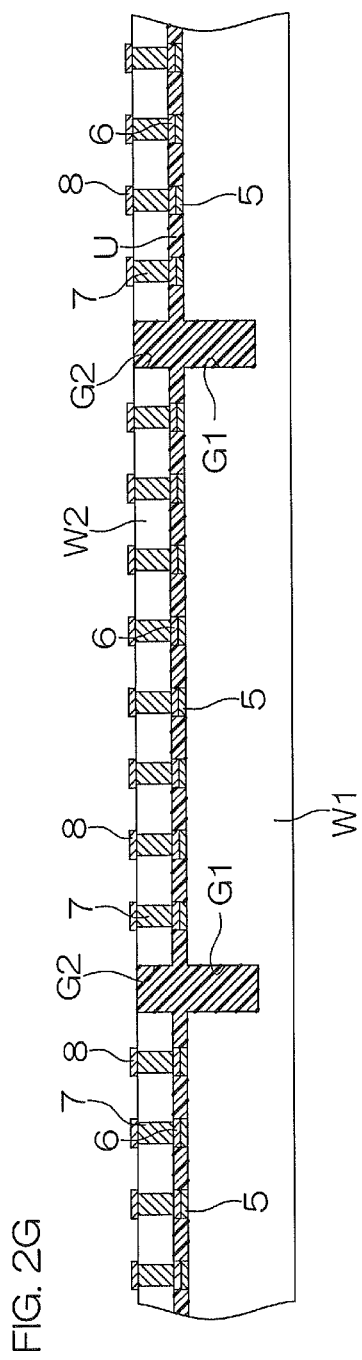

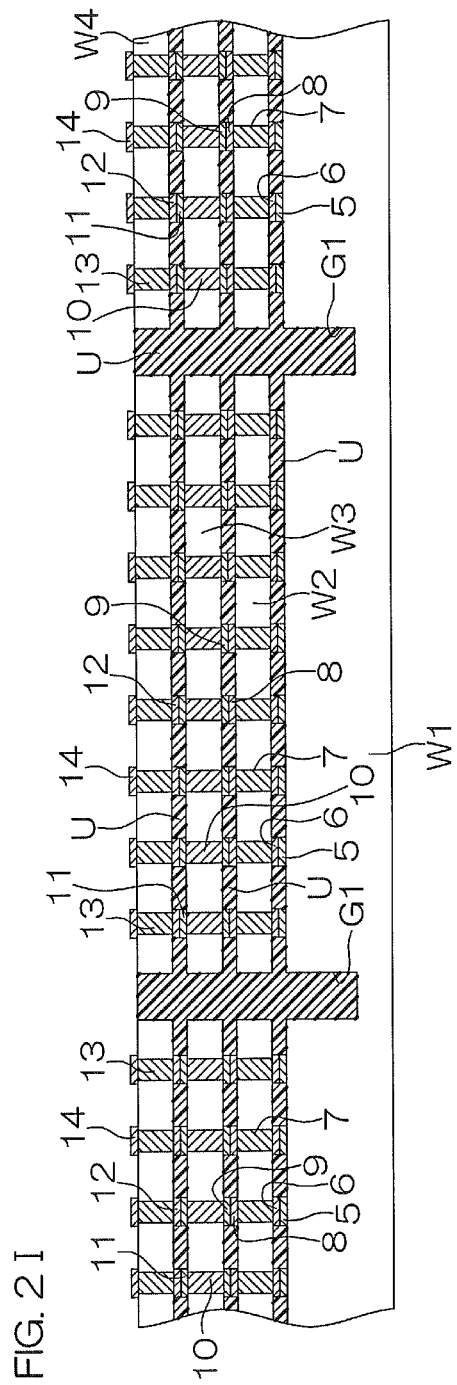

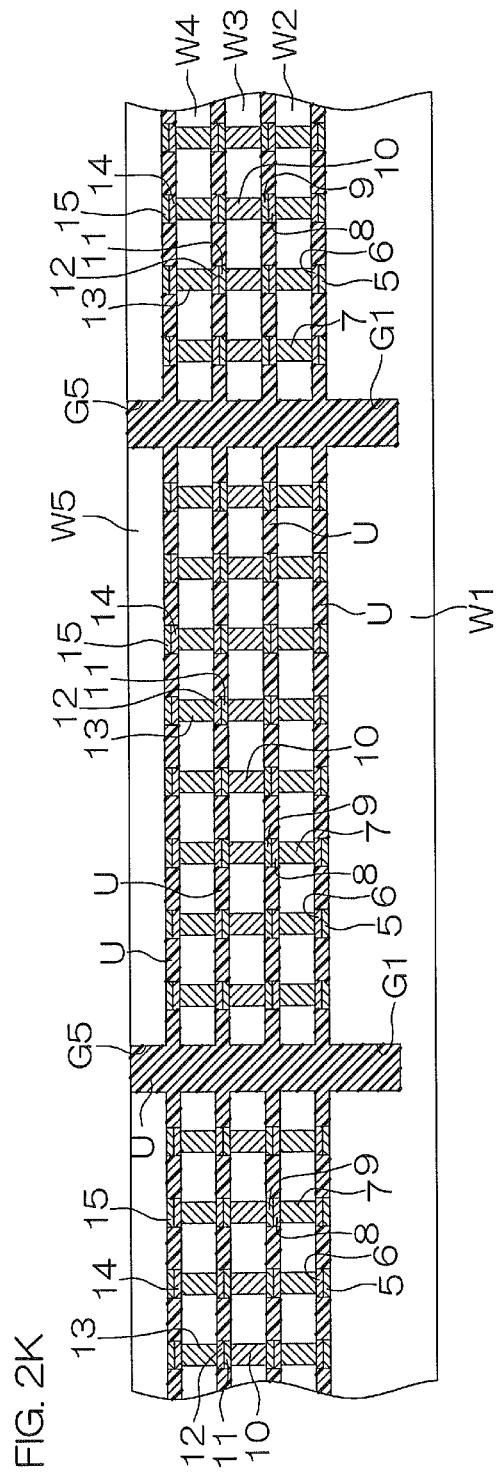

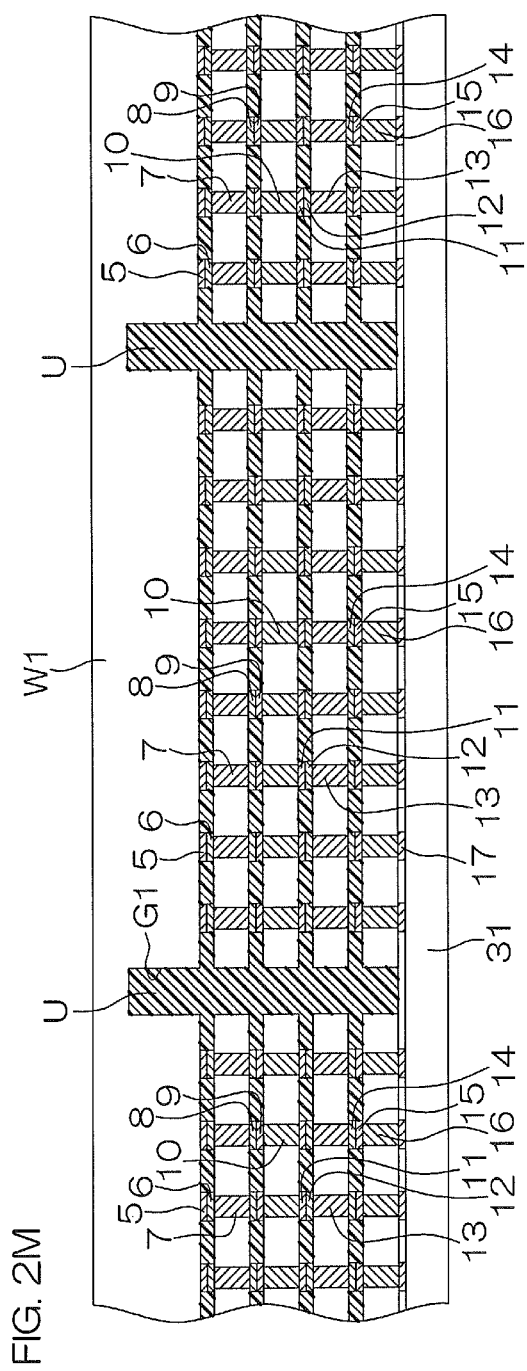

METHOD OF MANUFACTURING SEMICONDUCTOR DEVICE, SEMICONDUCTOR DEVICE AND MULTILAYER WAFER STRUCTURE

CROSS-REFERENCE TO RELATED APPLICATION

This application is a divisional of application Ser. No. 12/872,966, filed on Aug. 31, 2010, and issued as U.S. Pat. No. 8,729,698 B2 on May 20, 2014. Furthermore, this application claims the benefit of priority of Japanese application No. 2009-223266 filed on Sep. 28, 2009. The disclosures of the prior U.S. and Japanese applications are incorporated herein by reference.

BACKGROUND OF THE INVENTION

1. Field of the Invention

The present invention relates to a semiconductor device obtained by stacking a plurality of semiconductor chips and a method of manufacturing the same, as well as a structure obtained by stacking a plurality of semiconductor wafers.

2. Description of Related Art

A multichip module (MCM) is known as a highly integrated and highly functionalized semiconductor device.

In a typical conventional multichip module, a plurality of semiconductor chips are arranged in line on a substrate and connected with one another by wires, for example. In recent years, a multichip module obtained by stacking a plurality of semiconductor chips on a substrate and connecting the semiconductor chips with one another by wires thereby implementing miniaturization (reduction of a mounting area) has been provided.

In such a structure, the number of the wires connecting the semiconductor chips with one another is increased as the number of the semiconductor chips or the degree of integration of the semiconductor chips is increased. In general, pads to which end portions of the wires are bonded are aligned on peripheral edge portions of the surfaces of the semiconductor chips. Each wire is provided to extend over the peripheral edge portions of a pair of semiconductor chips. In order to avoid contact between the wires and prevent contact between the wires and capillaries holding the wires when bonding the same to one another, therefore, not less than constant intervals must be provided between the pads adjacent to one another. Therefore, the number of the pads arrangeable on each semiconductor chip (the number of connectable wires) is limited, and the number of the semiconductor chips or the degree of integration thereof cannot be increased beyond the limit. Further, influences exerted by the impedances of the wires cannot be eliminated, and the speed of data transmission between the semiconductor chips and the operating speed cannot be increased. In the structure of the conventional multichip module, therefore, high integration, high functionalization and increase in the operating speed are limited.

In order to implement higher integration, higher functionalization and a higher operating speed of the semiconductor device, a technique of connecting the semiconductor chips with one another by through silicon vias (TSVs) is now in the process of development. The through silicon vias pass through the semiconductor chips (silicon chips) in the thickness direction thereof. Each semiconductor chip is provided with a plurality of through silicon vias. A bump is arranged on the forward end of each through silicon via. A plurality of semiconductor chips are stacked on a substrate, and bumps arranged on the upper surface of each semiconductor chip and those arranged on the lower surface of a semiconductor chip opposed to the semiconductor chip from above are bonded to one another, thereby connecting the semiconductor chips with each other.

In the structure employing the technique, the through silicon vias can be provided in a larger number than the wires as compared with the structure obtained by connecting the semiconductor chips with one another by the wires, and hence the number of the semiconductor chips can be increased, thereby attaining higher integration and higher functionalization. Further, the through silicon vias can be provided in the number larger than that of the wires, whereby the quantities of data transferred between the semiconductor chips can be increased. In addition, the length of the through silicon vias is smaller than that of the wires, whereby the operating speed of the semiconductor device can be improved (increased).

FIGS. 3A to 3O are schematic sectional views successively showing steps of manufacturing a semiconductor device having semiconductor chips connected with one another by through silicon vias.

The semiconductor device having the semiconductor chips connected with one another by the through silicon vias is manufactured in a state of a semiconductor wafer obtained by aggregating a plurality of semiconductor chips.

As shown in FIG. 3A, the front surface of another semiconductor wafer W102 is opposed to the front surface of a semiconductor wafer W101. A plurality of bumps 101 and a plurality of bumps 102 are formed on positions of respective front surfaces of the semiconductor wafers W101 and W102 opposed to one another respectively. Then, the semiconductor wafer W102 is approximated to the semiconductor wafer W101, and the bumps 102 of the semiconductor wafer W102 are brought into contact with the bumps 101 of the semiconductor wafer W101 respectively. Thus, the semiconductor wafer W102 is supported on the semiconductor wafer W101 with a small interval.

Then, underfill (liquid resin) is injected into the space between the front surfaces of the semiconductor wafers W101 and W102, as shown in FIG. 3B.

Thereafter the rear surface of the semiconductor wafer W102 is polished, as shown in FIG. 3C.

When the semiconductor wafer W102 reaches a prescribed thickness, through silicon vias 103 passing through the semiconductor wafer W102 in the thickness direction are formed on the same positions as the bumps 102 in plan view respectively, as shown in FIG. 3D. More specifically, holes passing through the semiconductor wafer W102 are formed on the same positions as the bumps 102 of the semiconductor wafer W102 in plan view respectively by photolithography and etching. Then, insulating films made of silicon oxide ($SiO_2$) are formed on the inner surfaces of the holes by thermal oxidation or CVD (Chemical Vapor Deposition). Thereafter the holes are filled up with the material for the through silicon vias 103, whereby the through silicon bias 103 are formed to pass through the semiconductor wafer W102 in the thickness direction.

Then, bumps 104 are formed on the through silicon vias 103 respectively, as shown in FIG. 3E.

Then, the front surface of still another semiconductor wafer W103 is opposed to the rear surface of the semiconductor wafer W102, as shown in FIG. 3E Bumps 105 are formed on positions of the front surface of the semiconductor wafer W103 corresponding to those of the bumps 104 provided on the rear surface of the semiconductor wafer W102 respectively. Then, the semiconductor wafer W103 is approximated to the semiconductor wafer W102, and the bumps 105 of the semiconductor wafer W103 are brought into contact with the bumps 104 of the semiconductor wafer W102 respectively. Thus, the semiconductor wafer W103 is supported on the semiconductor wafer W102 with a small interval. Thereafter underfill is injected into the space between the rear surface of the semiconductor wafer W102 and the front surface of the semiconductor wafer W103.

Thereafter steps of reducing the thickness of the semiconductor wafer W103 by polishing the rear surface thereof (a step corresponding to that shown in FIG. 3C), forming through silicon vias 106 in the semiconductor wafer W103 (a step corresponding to that shown in FIG. 3D), forming bumps 107 on the through silicon vias 106 respectively (a step corresponding to that shown in FIG. 3E), bonding the front surface of a further semiconductor wafer W104 to the rear surface of the semiconductor wafer W103 (a step corresponding to that shown in FIG. 3F), reducing the thickness of the semiconductor wafer W104 by polishing the rear surface thereof (a step corresponding to that shown in FIG. 3C), forming through silicon vias 108 in the semiconductor wafer W104 (a step corresponding to that shown in FIG. 3D) and forming bumps 109 on the through silicon vias 108 respectively (a step corresponding to that shown in FIG. 3E) are carried out. As a result, a structure shown in FIG. 3G is obtained.

Then, the front surface of a further semiconductor wafer W105 is opposed to the rear surface of the semiconductor wafer W104, as shown in FIG. 3H. Bumps 110 are formed on positions of the front surface of the semiconductor wafer W105 corresponding to those of the bumps 109 provided on the rear surface of the semiconductor wafer W104 respectively. Then, the semiconductor wafer W105 is approximated to the semiconductor wafer W104, and the bumps 110 of the semiconductor wafer W105 are brought into contact with the bumps 109 of the semiconductor wafer W104 respectively. Thus, the semiconductor wafer W105 is supported on the semiconductor wafer W104 with a small interval. Thereafter underfill is injected into the space between the rear surface of the semiconductor wafer 104 and the front surface of the semiconductor wafer W105.

Thereafter the rear surface of the semiconductor wafer W105 is polished, as shown in FIG. 3I.

When the semiconductor wafer W105 reaches a prescribed thickness, through silicon vias 111 passing through the semiconductor wafer W105 are formed on the same positions as the bumps 110 in plan view respectively, as shown in FIG. 3J. Then, bumps 114 are formed on the through silicon vias 111 respectively.

Thereafter a glass plate 112 is bonded to the rear surface of the semiconductor wafer W105, as shown in FIG. 3K.

Then, the rear surface of the semiconductor wafer W101 is polished on the basis of the glass plate 112, as shown in FIG. 3L.

When the semiconductor wafer W101 reaches a prescribed thickness, dicing tapes 113 are bonded to the rear surface of the semiconductor wafer W101, as shown in FIG. 3M.

Thereafter the glass plate 112 is removed from the rear surface of the semiconductor wafer W105, as shown in FIG. 3N.

Then, the structure including the semiconductor wafers W101 to W105 is divided by dicing blades 115 into semiconductor devices each having semiconductor chips connected with one another by through silicon vias, as shown in FIG. 3O.

According to the manufacturing method, however, the dicing blades 115 come into contact with the semiconductor wafers W101 to W105 in the dicing. Therefore, force is directly applied from the dicing blades 115 to the semiconductor wafers W101 to W105, to chip or crack corner portions of the semiconductor chips (the semiconductor wafers W101 and W105). Further, the dicing blades 115 cut the multilayer structure of the semiconductor wafers W101 to W105 and the underfill, and hence the corner portions of the semiconductor chips are particularly easily chipped or cracked.

In a semiconductor device manufactured according to the manufacturing method, further, corner portions of the semiconductor chips may be damaged by chipping or cracking due to contact with a hand, not only in the dicing but also in handling.

SUMMARY OF THE INVENTION

An object of the present invention is to provide a semiconductor device and a method of manufacturing the same capable of preventing corner portions of semiconductor chips from damages as well as a multilayer wafer structure employed for manufacturing the semiconductor device.

The foregoing and other objects, features and effects of the present invention will become more apparent from the following detailed description of the embodiments with reference to the attached drawings.

BRIEF DESCRIPTION OF THE DRAWINGS

FIG. 1 is a schematic sectional view of a semiconductor device according to an embodiment of the present invention.

DETAILED DESCRIPTION OF PREFERRED EMBODIMENTS

Figure 2D:
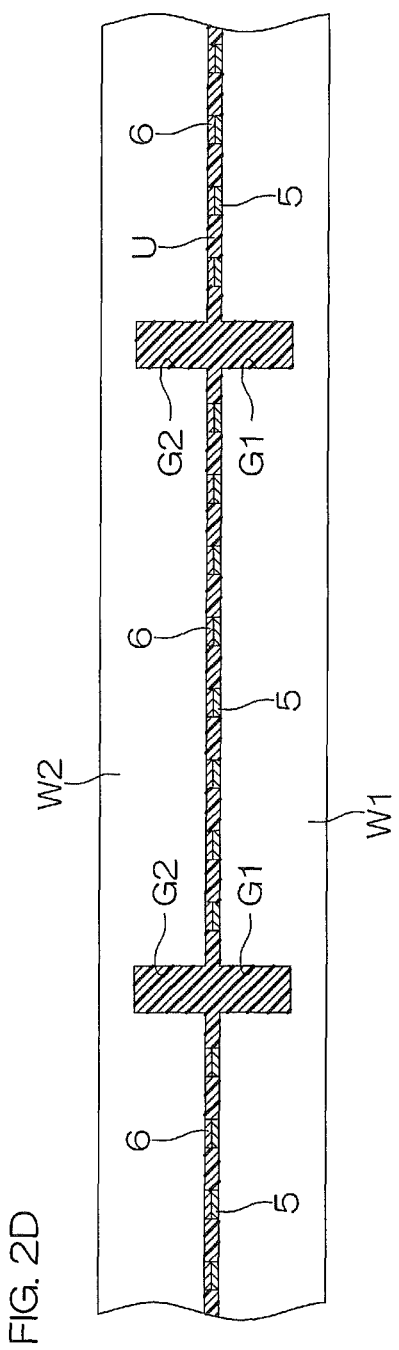
FIGS. 2A to 2Q are schematic sectional views showing steps of manufacturing the semiconductor device shown in FIG. 1.

A method of manufacturing a semiconductor device according to the present invention includes: a groove forming step of forming grooves on respective front surfaces of first and second semiconductor wafers each including an aggregate of a plurality of semiconductor chips, such that the grooves each extend on a dicing line set between the semiconductor chips and to have a larger width than the dicing line; an arranging step of arranging the first and second semiconductor wafers so that the front surfaces thereof are opposed to each other after the groove forming step; a sealing step of sealing the space between the first semiconductor wafer and the second semiconductor wafer with underfill; a polishing step of polishing respective rear surfaces of the first and second semiconductor wafers until at least the grooves are exposed after the arranging step and the sealing step; and a dicing step of cutting a structure including the first and second semiconductor wafers and the underfill on the dicing line after the polishing step.

The first and second semiconductor wafers are bonded to each other through the underfill while the front surfaces thereof are opposed to each other. After the bonding, the rear surfaces of the first and second semiconductor wafers are polished. The rear surfaces are polished until at least the grooves are exposed on the rear surfaces.

Thus, the underfill entering the grooves is exposed on the rear surfaces of the first and second semiconductor wafers respectively, and such a structure is obtained that the underfill passes through the rear surface of the first semiconductor wafer and the rear surface of the second semiconductor wafer on the dicing line.

In other words, the underfill forms a sealing layer sealing the space between the first semiconductor wafer and the second semiconductor wafer and a protective member provided on the dicing line to pass through the rear surface of the first semiconductor wafer and the rear surface of the second semiconductor wafer, and a multilayer wafer structure including the first and second semiconductor wafers, the sealing layer and the protective member is obtained.

Thereafter the multilayer wafer structure is diced.

Thus, the first and second semiconductor wafers are divided into a plurality of first semiconductor chips and a plurality of second semiconductor chips respectively. Then, a semiconductor device including a first semiconductor chip, a second semiconductor chip arranged on the first semiconductor chip so that the front surfaces thereof are opposed to each other, a sealing layer sealing the space between the first semiconductor chip and the second semiconductor chip and a protective member, made of the same material as the sealing layer, covering the overall regions of the side surfaces of the first and second semiconductor chips so that at least an end surface closer to the rear surface of the first semiconductor chip is flush with the rear surface of the first semiconductor chip is obtained.

In the multilayer wafer structure, the protective member is provided on the dicing line, and the protective member on the dicing line is cut in dicing. Thus, a dicing blade or the like employed for the dicing does not come into contact with the semiconductor wafers (the semiconductor chips), whereby the semiconductor wafers are not damaged by coming into contact with the dicing blade or the like.

In the semiconductor device obtained after the dicing, the overall regions of the side surfaces of the semiconductor chips are covered with the protective member, whereby the semiconductor chips can be prevented from damages resulting from contact with a hand in handling.

Thus, corner portions of the semiconductor chips can be prevented from damages in and after the dicing.

The depth of the grooves is preferably set to a value obtained by adding 20 μm to the thickness of the first and second semiconductor wafers (the thickness of the semiconductor chips) after the polishing step. In this case, the grooves can be reliably exposed on the rear surfaces of the semiconductor wafers by polishing the rear surfaces. In consideration of the thickness of the first and second semiconductor wafers before the polishing step, abrasion of the dicing blade or the material for a dicing tape used in the dicing, however, the depth of the grooves may alternatively be set to an optimum value other than the value obtained by adding 20 μm to the thickness of the first and second semiconductor wafers after the polishing step.

Surface bumps may be formed on the front surfaces of the first and second semiconductor wafers respectively, and the surface bump of the first semiconductor wafer and the surface bump of the second semiconductor wafer may be brought into contact with each other in the arranging step.

In the semiconductor device obtained in this case, surface bumps are formed on the front surfaces of the first and second semiconductor chips respectively, and the surface bump of the first semiconductor chip and the surface bump of the second semiconductor chip are in contact with each other. Thus, the first semiconductor chip and the second semiconductor chip can be mechanically and electrically connected with each other.

The polishing step may include the steps of polishing the rear surface of the first semiconductor wafer and polishing the rear surface of the second semiconductor wafer. A through via passing through the second semiconductor wafer in the thickness direction may be formed in the second semiconductor wafer on the same position as the surface bump in plan view after termination of the polishing of the rear surface of the second semiconductor wafer and before starting of the polishing of the rear surface of the first semiconductor wafer, and a rear bump may be formed on the through via exposed on the rear surface of the second semiconductor wafer.

In the semiconductor device obtained in this case, a through via is formed in the second semiconductor chip on the same position as the surface bump of the second semiconductor wafer in plan view to pass through the second semiconductor chip in the thickness direction, and a rear bump is formed on the through via exposed on the rear surface of the second semiconductor chip.

Further, a third semiconductor wafer including an aggregate of a plurality of semiconductor chips may be arranged on the second semiconductor wafer, so that the front surface of the third semiconductor wafer is opposed to the rear surface of the second semiconductor wafer. In this case, a groove having a larger width than a dicing line set between the semiconductor chips is formed on the front surface of the third semiconductor wafer along the dicing line. A surface bump is formed on the front surface of the third semiconductor wafer, and brought into contact with the rear bump of the second semiconductor wafer. Further, underfill is interposed between the second semiconductor wafer and the third semiconductor wafer. The second semiconductor wafer and the third semiconductor wafer are bonded to each other through the underfill and the rear surface of the third semiconductor wafer is thereafter polished until at least the groove is exposed, whereby a protective member passing through the rear surface of the first semiconductor wafer and the rear surface of the third semiconductor wafer is obtained on the dicing line.

The semiconductor device obtained in this case further includes a third semiconductor chip having a surface bump formed on the front surface thereof and brought into contact with the rear bump of the second semiconductor chip and a second sealing layer sealing the space between the second semiconductor chip and the third semiconductor chip. The protective member further covers the overall regions of the side surfaces of the third semiconductor chip. Therefore, corner portions of the third semiconductor chip can be prevented from damages. In addition, the second semiconductor chip and the third semiconductor chip can be mechanically and electrically connected with each other by bringing the rear bump of the second semiconductor chip and the surface bump of the third semiconductor chip into contact with each other.

An embodiment of the present invention is now described in detail with reference to the attached drawings.

FIG. 1 is a schematic sectional view of a semiconductor device according to the embodiment of the present invention.

A semiconductor device 1 includes a support substrate 2. The support substrate 2 is made of silicon (Si), for example.

A plurality of internal terminals 3 are formed on the front surface of the support substrate 2. The internal terminals 3 are made of a metallic material containing aluminum (Al), for example. The internal terminals 3 are arranged correspondingly to the arrangement of rear bumps 17 described later.

External terminals 4 of the same number as the internal terminals 3 are arranged on the rear surface of the support substrate 2 in the form of a matrix. The external terminals 4 are made of a metallic material such as solder, for example, and provided in the form of balls. The internal terminals 3 and the external terminals 4 are electrically connected in one-to-one correspondence to one another through wires (not shown)

formed on the front surface of the support substrate 2 and vias (not shown) passing through the support substrate 2 in the thickness direction.

Five semiconductor chips C1 to C5 are stacked on the support substrate 2. The first to fifth semiconductor chips 1 to C5 are made of silicon, for example. The semiconductor chips C1 to C5 have the same rectangular outer shapes in plan view. The thickness of the semiconductor chips C1 to C5 is 10 μm, for example.

The uppermost first semiconductor chip C1 is provided in a state directing the front surface serving as an element forming surface downward. A plurality of surface bumps 5 are formed on the front surface of the semiconductor chip C1. The surface bumps 5 are partially or entirely electrically connected with elements such as transistors formed on the semiconductor chip C1 through wires (not shown) or the like.

The second semiconductor chip C2 located immediately under the first semiconductor chip C1 is provided in a state directing the front surface thereof upward. Thus, the front surface of the semiconductor chip C2 is opposed to that of the semiconductor chip C1. Surface bumps 6 are formed on positions of the front surface of the semiconductor chip C2 corresponding to the surface bumps 5 of the semiconductor chip C1 respectively. The surface bumps 6 are partially or entirely electrically connected with elements such as transistors formed on the semiconductor chip C2 through wires (not shown) or the like.

The surface bumps 6 and the surface bumps 5 opposed thereto are bonded to one another while the forward ends thereof are in contact with one another. Thus, the first semiconductor chip C1 is supported on the second semiconductor chip C2, while the first and second semiconductor chips C1 and C2 are electrically connected with each other through the surface bumps 5 and 6.

In the semiconductor chip C2, through silicon vias 7 are formed on the same positions as the surface bumps 6 in plan view respectively, to pass through the semiconductor chip C2 in the thickness direction. In other words, the through silicon vias 7 are formed in the semiconductor chip C2 on positions opposed to the surface bumps 5 of the semiconductor chip C1 respectively to pass through the front surface and the rear surface of the semiconductor chip C2, and the surface bumps 6 are arranged on end surfaces of the through silicon vias 7 exposed on the front surface of the semiconductor chip C2 respectively. Although not shown, insulating films made of silicon oxide ($SiO_2$) are interposed between the through silicon vias 7 and the inner surfaces of via holes in which the through silicon vias 7 are embedded (a peripheral surface of the semiconductor chip C2 in contact with the through silicon vias 7). The insulating films are formed by thermal oxidation or CVD.

On the rear surface of the semiconductor chip C2, rear bumps 8 are arranged on end surfaces of the through silicon vias 7 exposed on the rear surface respectively.

The third semiconductor chip C3 located immediately under the second semiconductor chip C2 is provided in a state directing the front surface thereof upward. Thus, the front surface of the semiconductor chip C3 is opposed to the rear surface of the second semiconductor chip C2. Surface bumps 9 are formed on positions of the front surface of the semiconductor chip C3 opposed to the rear bumps 8 of the semiconductor chip C2 respectively. The surface bumps 9 are partially or entirely electrically connected with elements such as transistors formed on the semiconductor chip C3 through wires (not shown) or the like.

The surface bumps 9 and the rear bumps 8 opposed thereto are bonded to one another while the forward ends thereof are in contact with one another. Thus, the semiconductor chips C1 and C2 are supported on the third semiconductor chip C3, and the second and third semiconductor chips C2 and C3 are electrically connected with each other through the rear bumps 8 and the surface bumps 9. Further, the first and third semiconductor chips C1 and C3 are electrically connected with each other through the surface bumps 5, 6 and 9, the through silicon vias 7 and the rear bumps 8.

In the semiconductor chip C3, through silicon vias 10 are formed on the same positions as the surface bumps 9 in plan view respectively, to pass through the semiconductor chip C3 in the thickness direction. In other words, the through silicon vias 10 are formed in the semiconductor chip C3 on positions opposed to the rear bumps 8 of the semiconductor chip C2 respectively to pass through the front surface and the rear surface of the semiconductor chip C3, and the surface bumps 9 are arranged on end surfaces of the through silicon vias 10 exposed on the front surface of the semiconductor chip C3 respectively. Although not shown, insulating films made of silicon oxide are interposed between the through silicon vias 10 and the inner surfaces of via holes in which the through silicon vias 10 are embedded (a peripheral surface of the semiconductor chip C3 in contact with the through silicon vias 10).

On the rear surface of the semiconductor chip C3, rear bumps 11 are arranged on end surfaces of the through silicon vias 10 exposed on the rear surface respectively.

The fourth semiconductor chip C4 located immediately under the third semiconductor chip C3 is provided in a state directing the front surface thereof upward. Thus, the front surface of the semiconductor chip C4 is opposed to the rear surface of the third semiconductor chip C3. Surface bumps 12 are formed on positions of the front surface of the semiconductor chip C4 opposed to the rear bumps 11 of the semiconductor chip C3 respectively. The surface bumps 12 are partially or entirely electrically connected with elements such as transistors formed on the semiconductor chip C4 through wires (not shown) or the like.

The surface bumps 12 and the rear bumps 11 opposed thereto are bonded to one another while the forward ends thereof are in contact with one another. Thus, the semiconductor chips C1 to C3 are supported on the fourth semiconductor chip C4, and the third and fourth semiconductor chips C3 and C4 are electrically connected with each other through the rear bumps 11 and the surface bumps 12. Further, the first and fourth semiconductor chips C1 and C4 are electrically connected with each other through the surface bumps 5, 6, 9 and 12, the through silicon vias 7 and 10 and the rear bumps 8 and 11. In addition, the second and fourth semiconductor chips C2 and C4 are electrically connected with each other through the surface bumps 9 and 12, the through silicon vias 10 and the rear bumps 8 and 11.

In the semiconductor chip C4, through silicon vias 13 are formed on the same positions as the surface bumps 12 in plan view respectively, to pass through the semiconductor chip C4 in the thickness direction. In other words, the through silicon vias 13 are formed on positions of the semiconductor chip C4 opposed to the rear bumps 11 of the semiconductor chip C3 respectively to pass through the front surface and the rear surface of the semiconductor chip C4, and the surface bumps 12 are arranged on end surfaces of the through silicon vias 13 exposed on the front surface of the semiconductor chip C4 respectively. Although not shown, insulating films made of silicon oxide are interposed between the through silicon vias 13 and the inner surfaces of via holes in which the through silicon vias 13 are embedded (a peripheral surface of the semiconductor chip C4 in contact with the through silicon vias 13). The insulating films are formed by thermal oxidation or CVD.

On the rear surface of the semiconductor chip C4, rear bumps 14 are arranged on end surfaces of the through silicon vias 13 exposed on the rear surface respectively.

The fifth semiconductor chip C5 located immediately under the fourth semiconductor chip C4 is provided in a state directing the front surface thereof upward. Thus, the front surface of the semiconductor chip C5 is opposed to the rear surface of the fourth semiconductor chip C4. Surface bumps 15 are formed on positions of the front surface of the semiconductor chip C5 opposed to the rear bumps 14 of the semiconductor chip C4 respectively. The surface bumps 15 are partially or entirely electrically connected with elements such as transistors formed on the semiconductor chip C5 through wires (not shown) or the like.

The surface bumps 15 and the rear bumps 14 opposed thereto are bonded to one another while the forward ends thereof are in contact with one another. Thus, the semiconductor chips C1 to C4 are supported on the fifth semiconductor chip C5, while the fourth and fifth semiconductor chips C4 and C5 are electrically connected with each other through the rear bumps 14 and the surface bumps 15. The first and fifth semiconductor chips C1 and C5 are electrically connected with each other through the surface bumps 5, 6, 9, 12 and 15, the through silicon vias 7, 10 and 13 and the rear bumps 8, 11 and 14. The second and fifth semiconductor chips C2 and C5 are electrically connected with each other through the surface bumps 9, 12 and 15, the through silicon vias 10 and 13 and the rear bumps 8, 11 and 14. The third and fifth semiconductor chips C3 and C5 are electrically connected with each other through the surface bumps 12 and 15, the through silicon vias 13 and the rear bumps 11 and 14.

In the semiconductor chip C5, through silicon vias 16 are formed on the same positions as the surface bumps 15 in plan view respectively, to pass through the semiconductor chip C5 in the thickness direction. In other words, the through silicon vias 16 are formed on positions of the semiconductor chip C5 opposed to the rear bumps 14 of the semiconductor chip C4 respectively to pass through the front surface and the rear surface of the semiconductor chip C5, and the surface bumps 15 are arranged on end surfaces of the through silicon vias 16 exposed on the front surface of the semiconductor chip C5 respectively. Although not shown, insulating films made of silicon oxide or silicon nitride (SiN) are interposed between the through silicon vias 16 and the inner surfaces of via holes in which the through silicon vias 16 are embedded (a peripheral surface of the semiconductor chip C5 in contact with the through silicon vias 16).

On the rear surface of the semiconductor chip C5, the rear bumps 17 are arranged on end surfaces of the through silicon vias 16 exposed on the rear surface respectively.

The surface bumps 5, 6, 9, 12 and 15 and the rear bumps 8, 11, 14 and 17 are made of copper (Cu), nickel (Ni) or gold (Au), for example, and metal layers meltable by heating may be provided on the surfaces thereof. The surface bumps 5, 6, 9, 12 and 15 and the rear bumps 8, 11, 14 and 17 may alternatively be made of solder. The through silicon vias 7, 10, 13 and 16 are made of copper (Cu) or polysilicon, for example.

Sealing layers (underfill) 18 to 21 are interposed between the semiconductor chips C1 to C5 respectively. More specifically, the sealing layer 18 is interposed between the front surfaces of the first and second semiconductor chips C1 and C2, to seal the space therebetween. The sealing layer 19 is interposed between the rear surface of the second semiconductor chip C2 and the front surface of the third semiconductor chip C3, to seal the space therebetween. The sealing layer 20 is interposed between the rear surface of the third semiconductor chip C3 and the front surface of the fourth semiconductor chip C4, to seal the space therebetween. The sealing layer 21 is interposed between the rear surface of the fourth semiconductor chip C4 and the front surface of the fifth semiconductor chip C5, to seal the space therebetween.

In the semiconductor device 1, a protective member 22 made of the same material as the sealing layers 18 to 21 is provided to surround side portions of the semiconductor chips C1 to C5. The protective member 22 collectively covers the overall regions of the side surfaces of the semiconductor chips C1 to C5. The upper end surface (the end surface closer to the rear surface of the first semiconductor chip C1) of the protective member 22 is flush with the rear surface of the first semiconductor chip C1, and the lower end surface (the end surface closer to the rear surface of the fifth semiconductor chip C5) is flush with the rear surface of the fifth semiconductor chip C5.

The rear bumps 17 of the semiconductor chip C5 are bonded to the internal terminals 3 provided on the front surface of the support substrate 2 in contact therewith, whereby the semiconductor chips C1 to C5 are supported on the support substrate 2 in a stacked state, and electrically connected with the internal terminals 3.

Figure 2H:
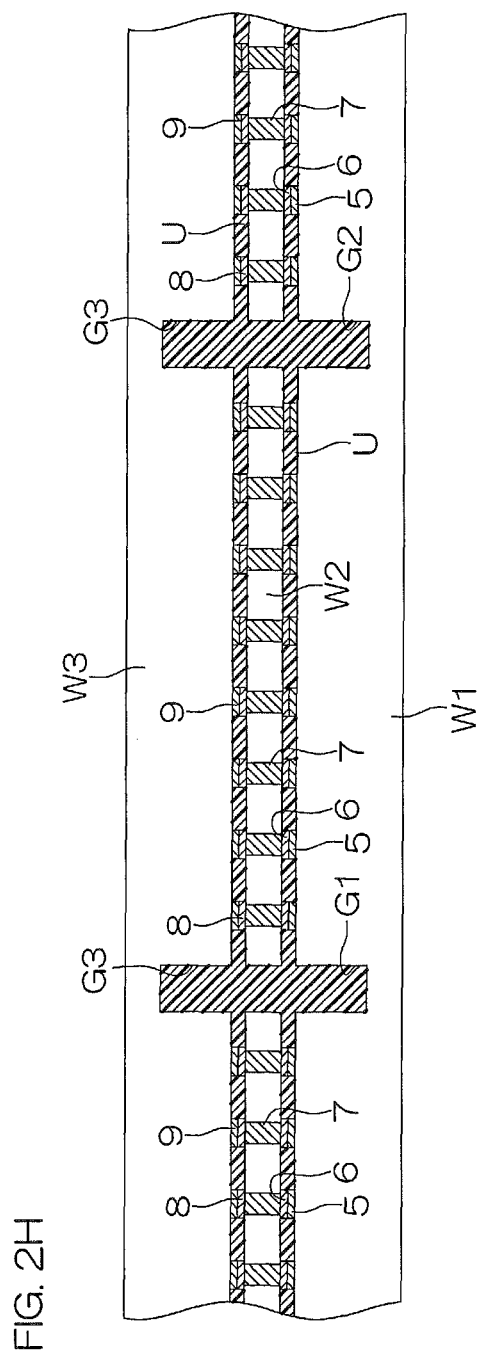
Figure 2J:
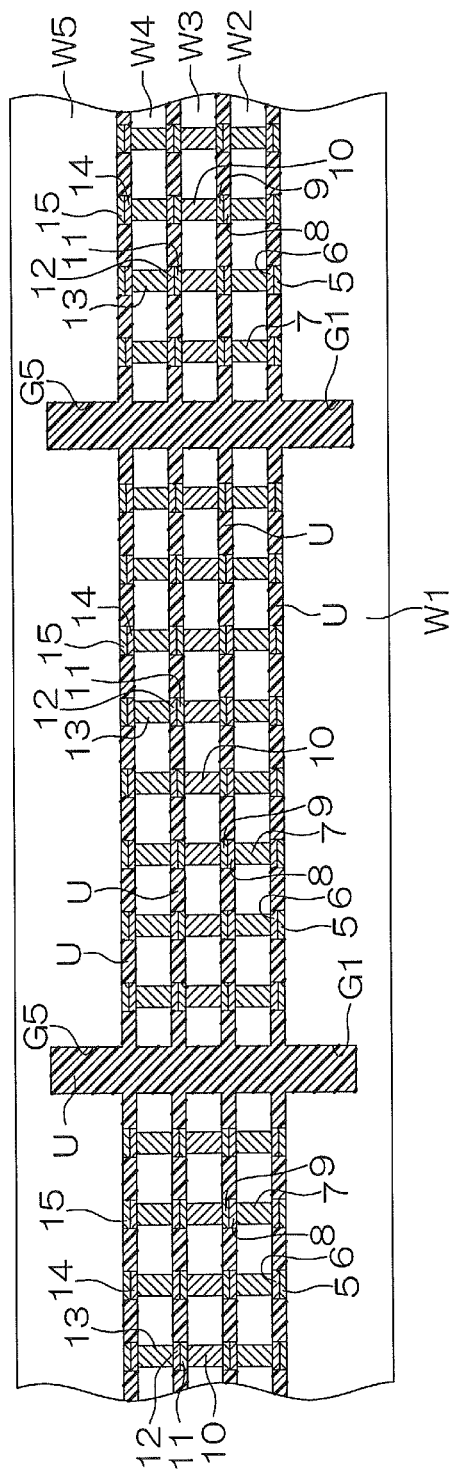
Figure 2L:
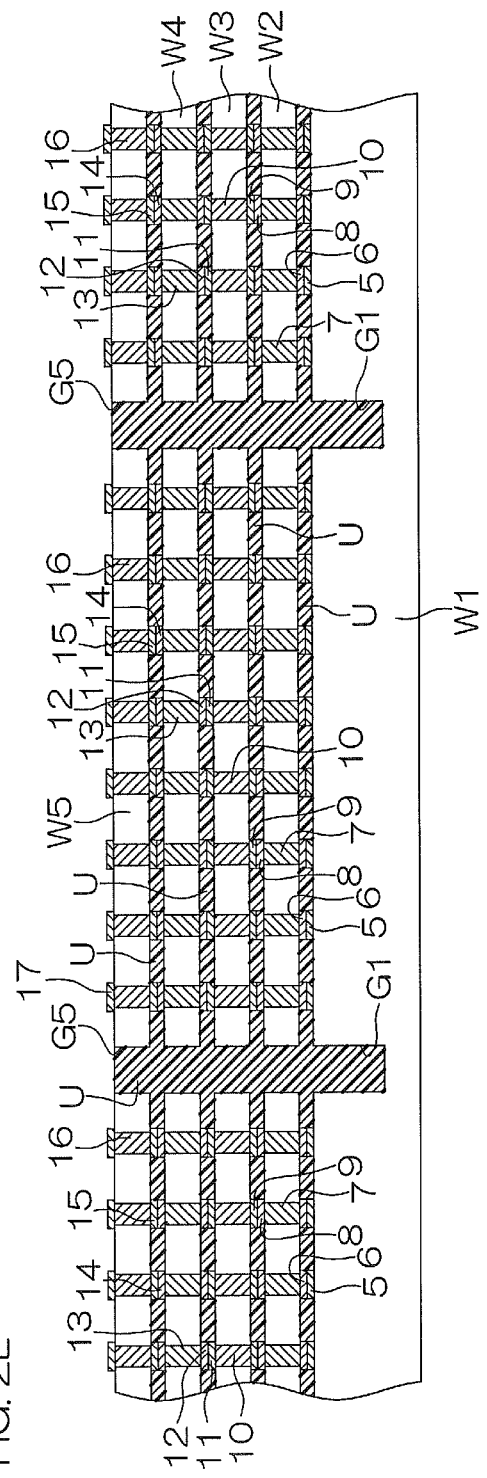
Figure 2N:
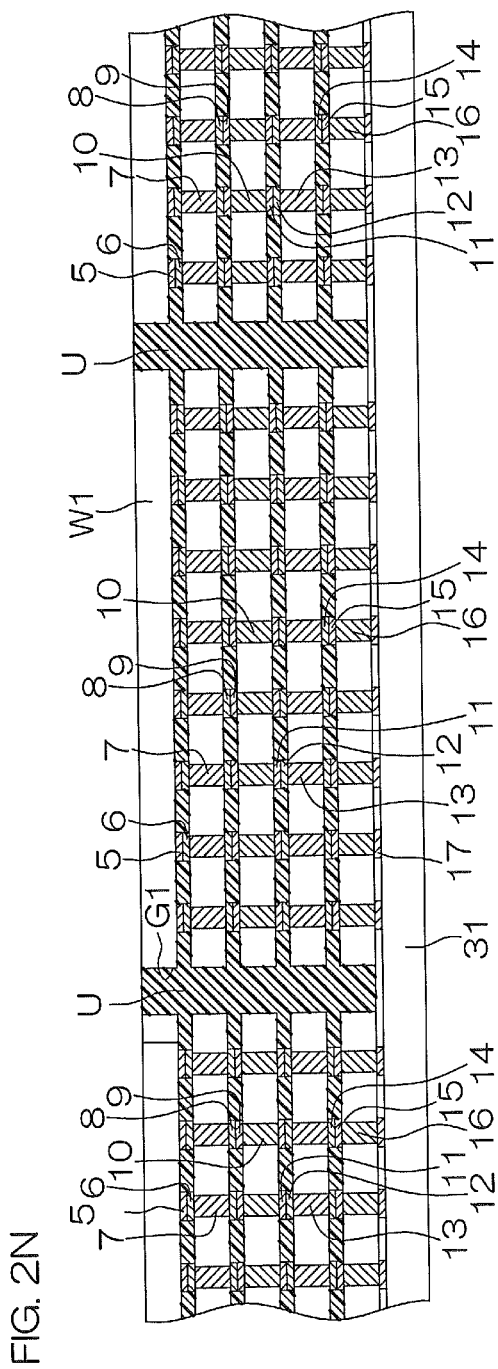
Figure 20:
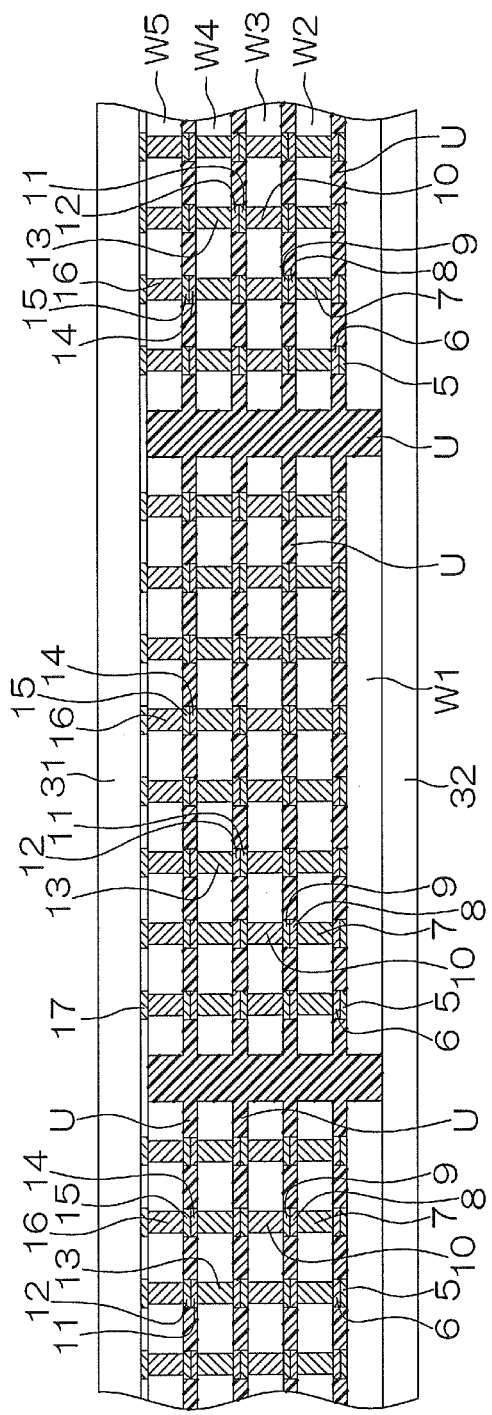
Figure 2P:
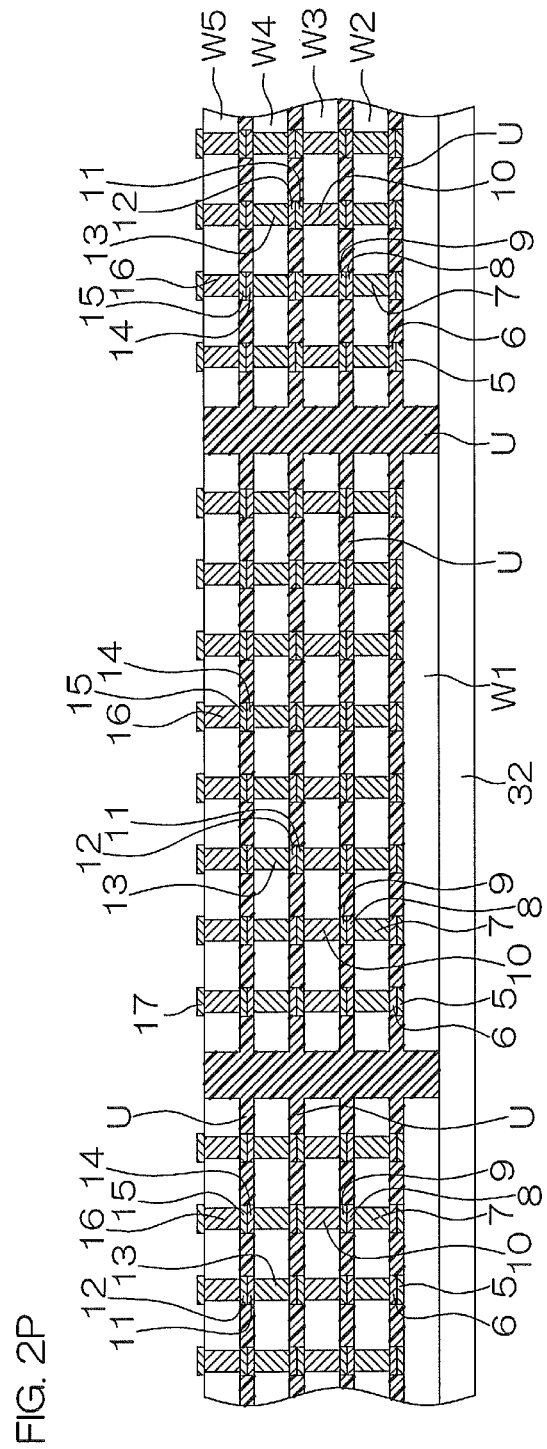
Figure 2Q:
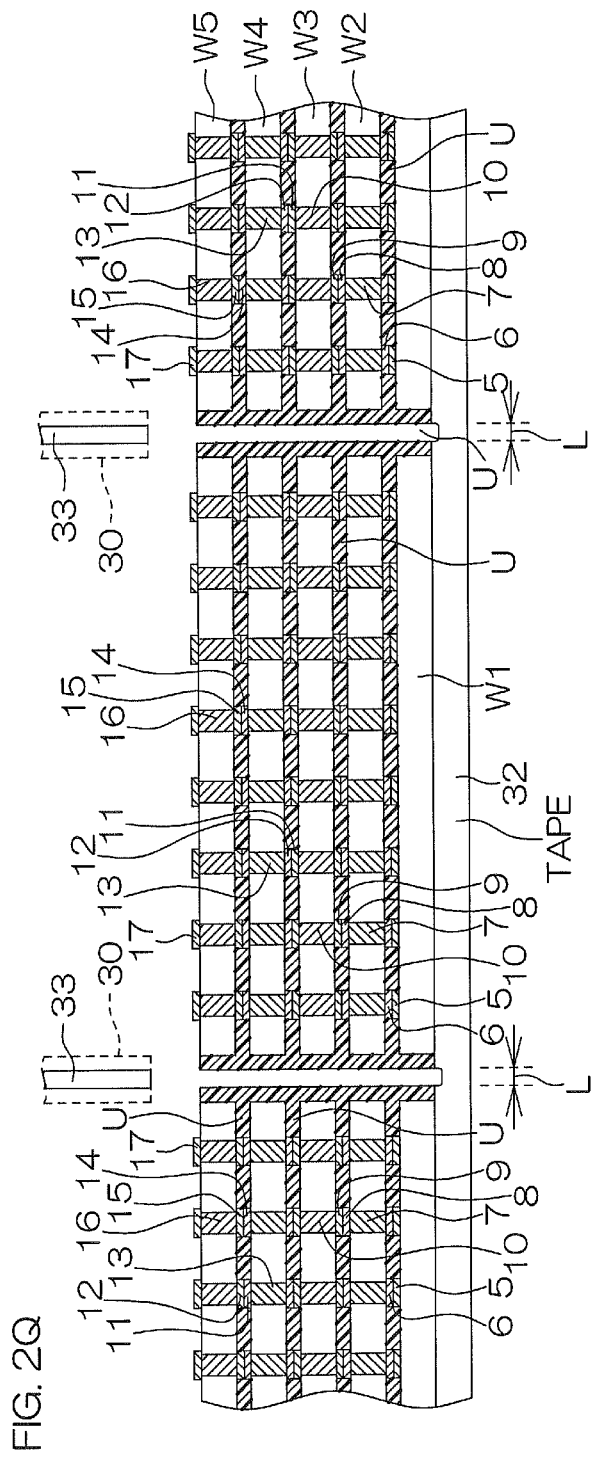
Figure 3A:
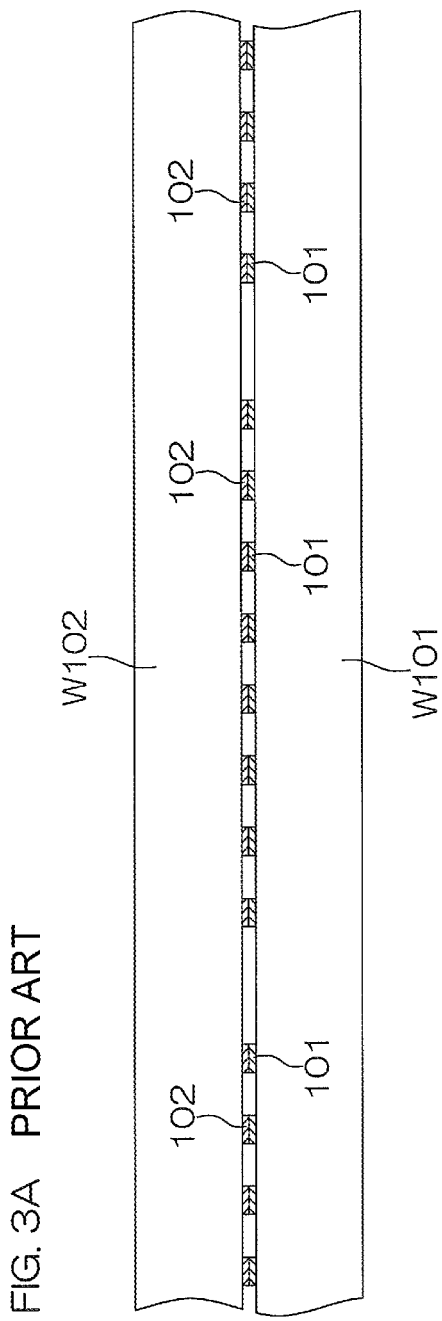
FIGS. 3A to 3O are schematic sectional views showing steps of manufacturing a conventional semiconductor device.
Figure 3B:
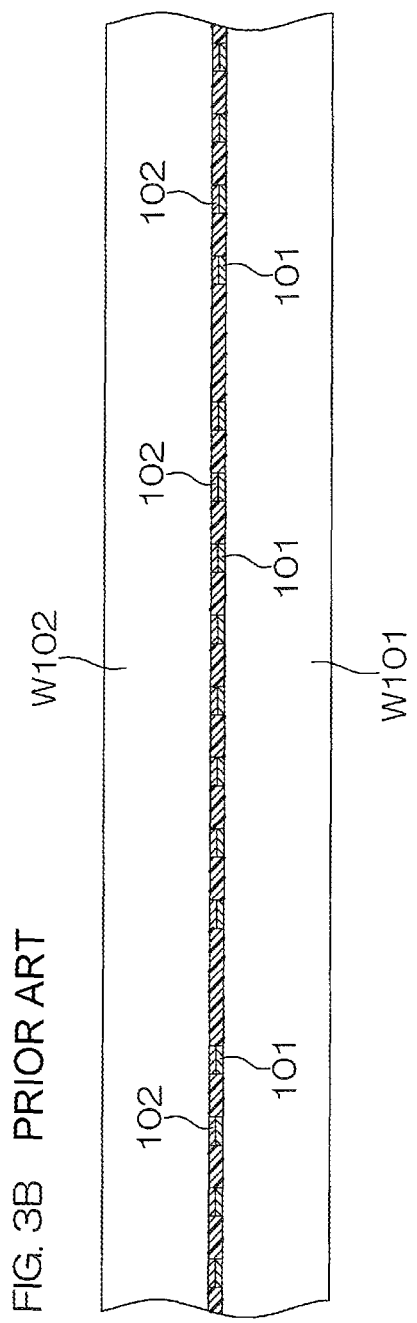
Figure 3C:
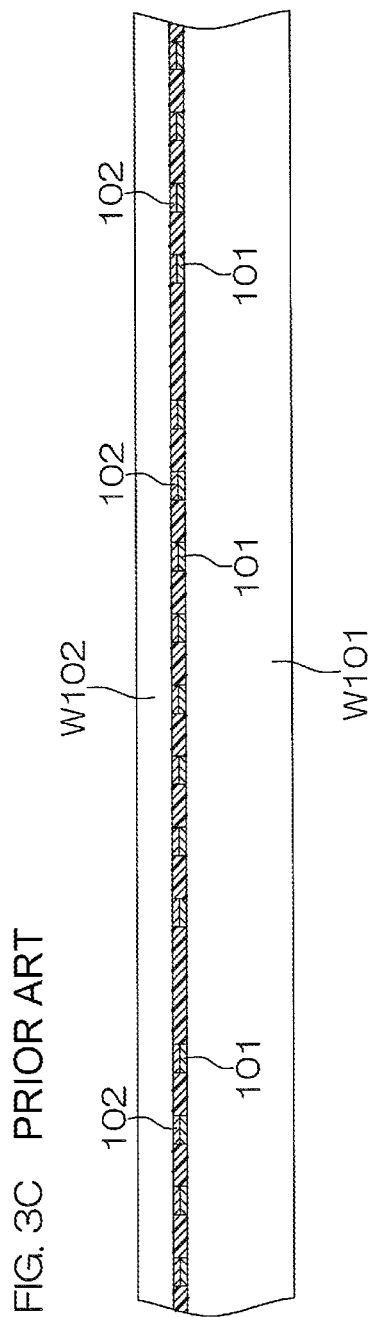
Figure 3D:
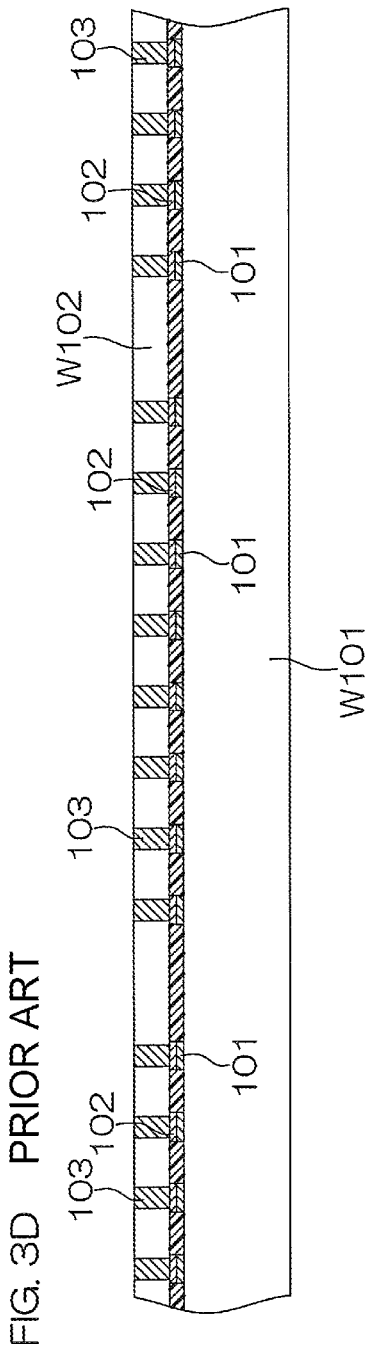
Figure 3E:
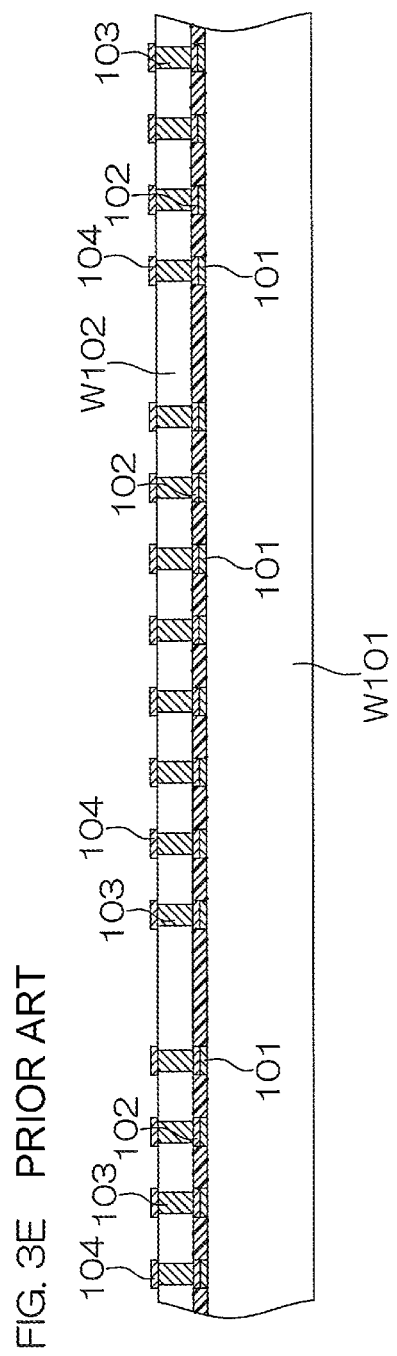
Figure 3F:
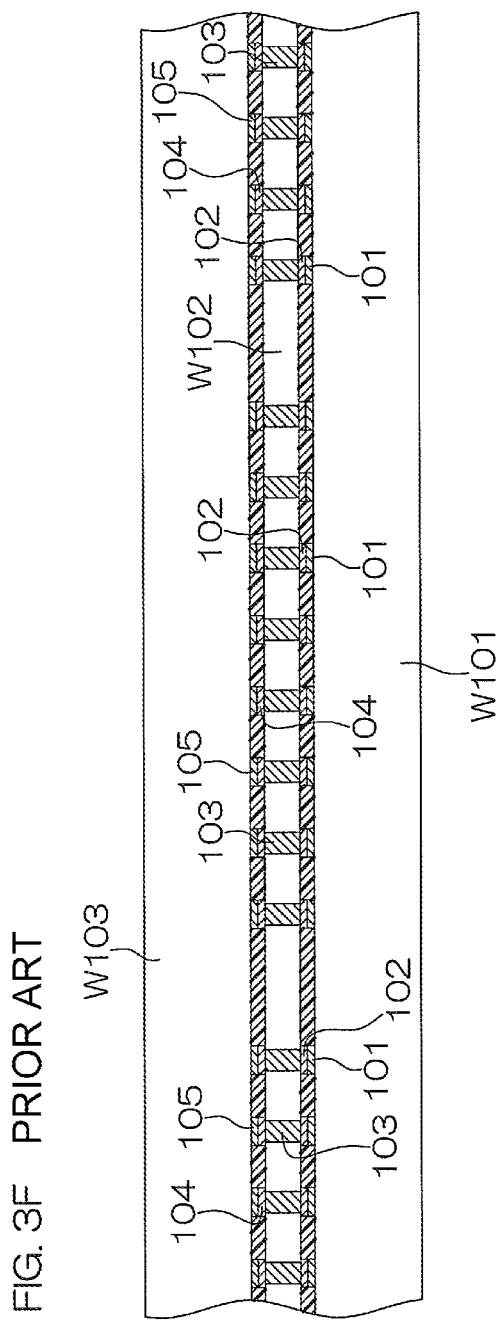
Figure 3G:
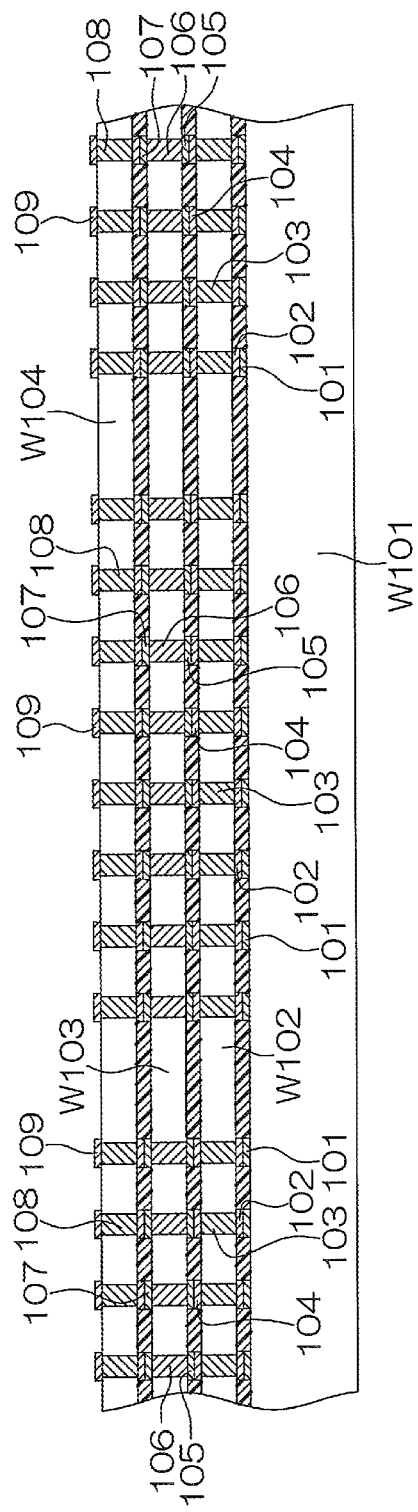
Figure 3H:
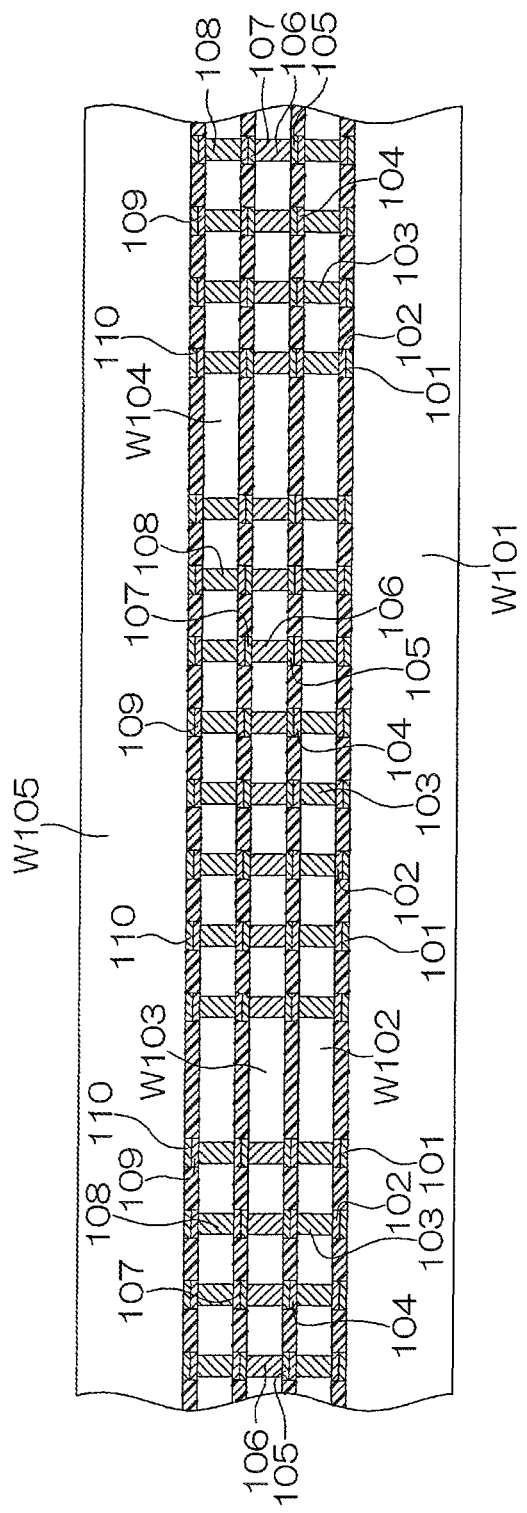
Figure 3I:
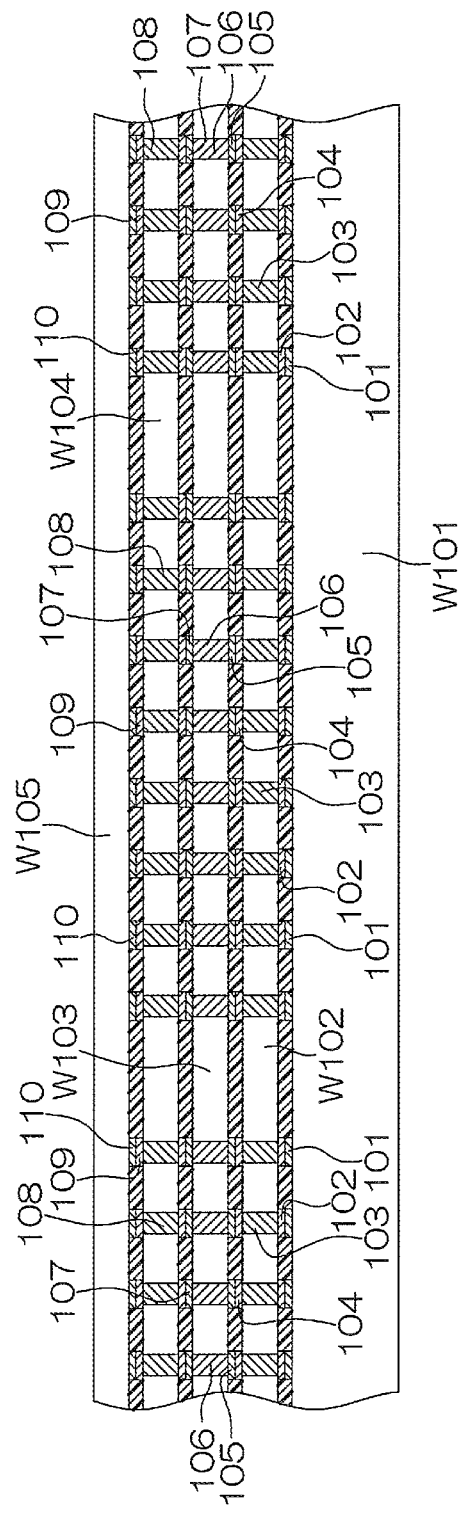
Figure 3J:
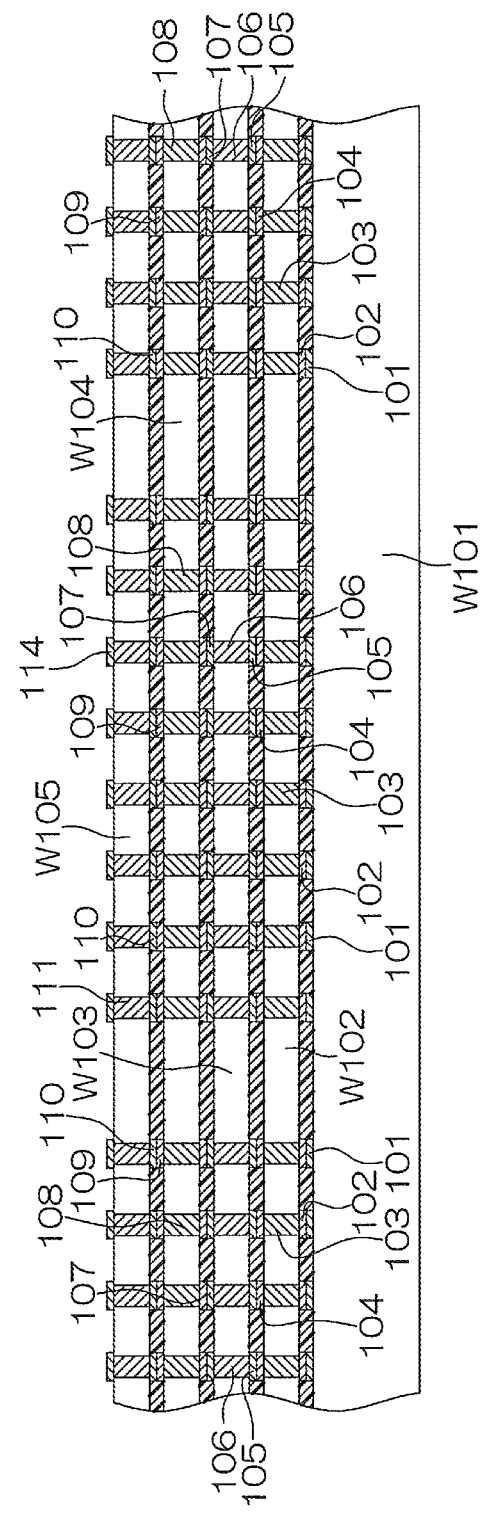
Figure 3K:
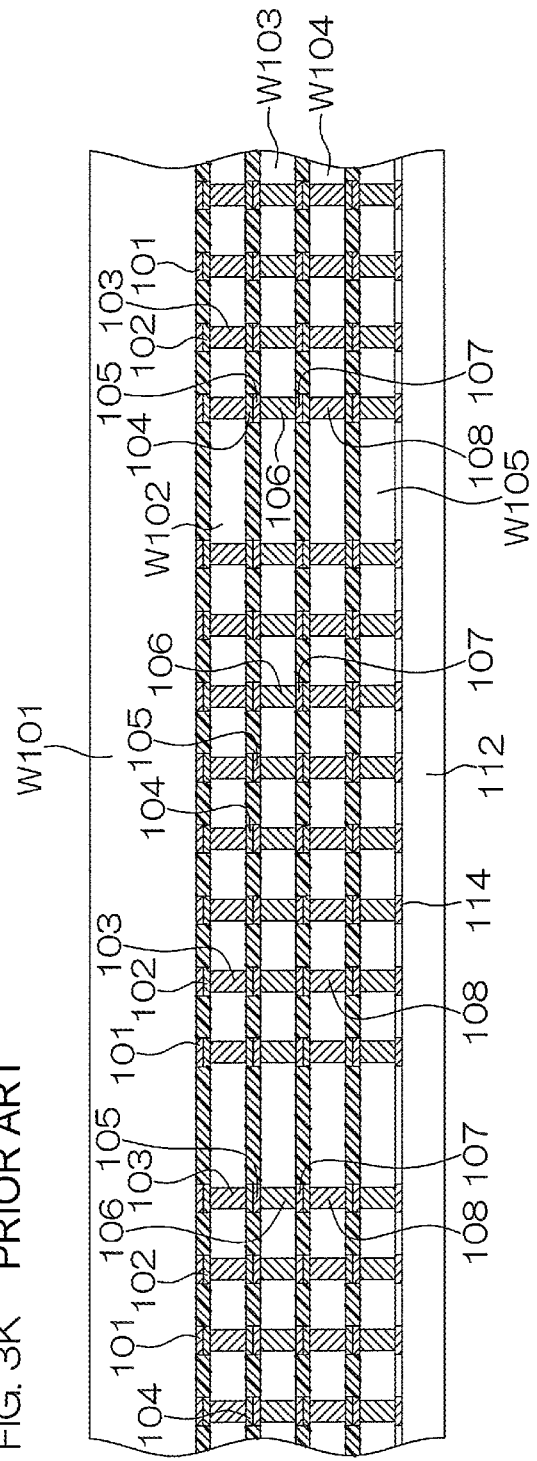
Figure 3L:
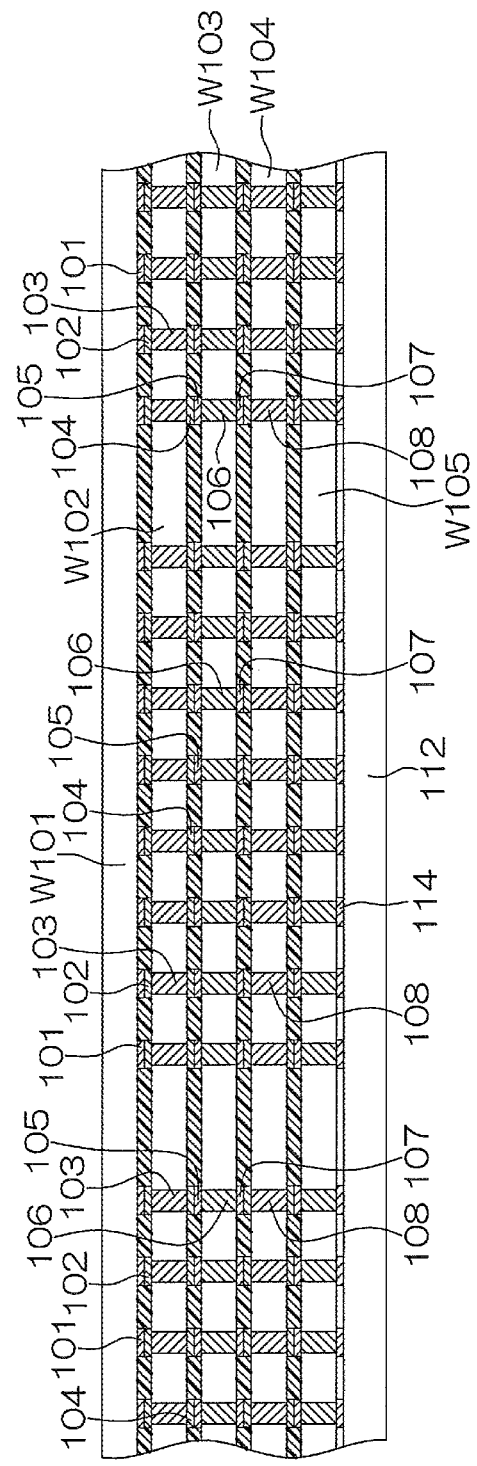
Figure 3M:
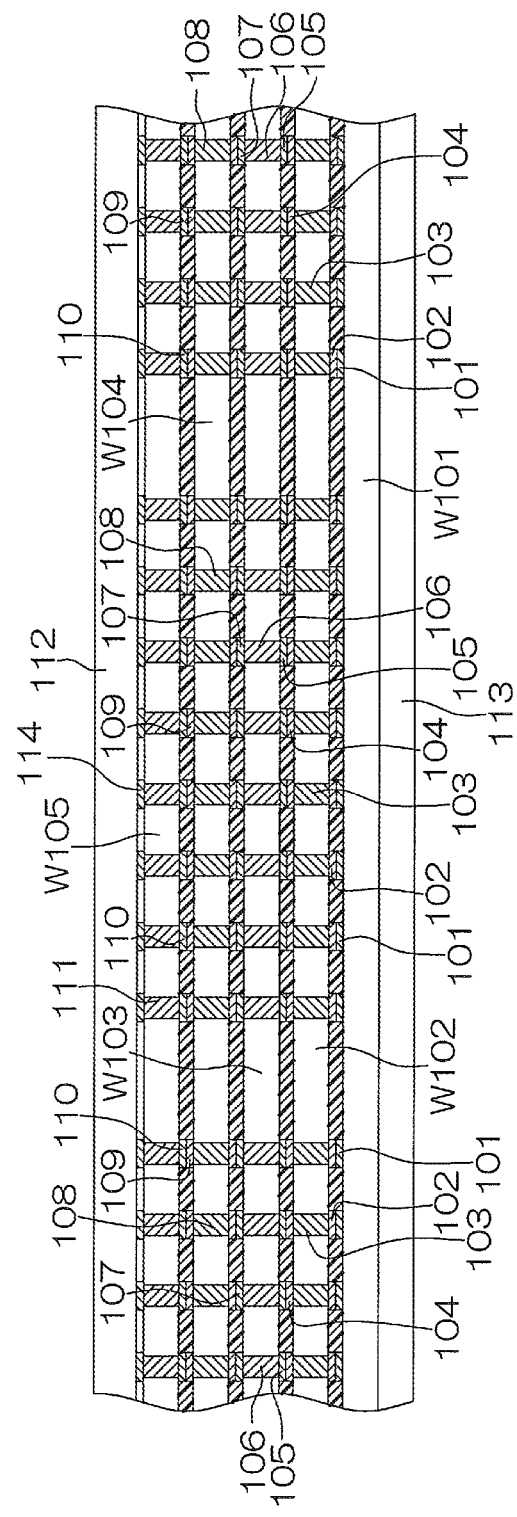
Figure 3N:
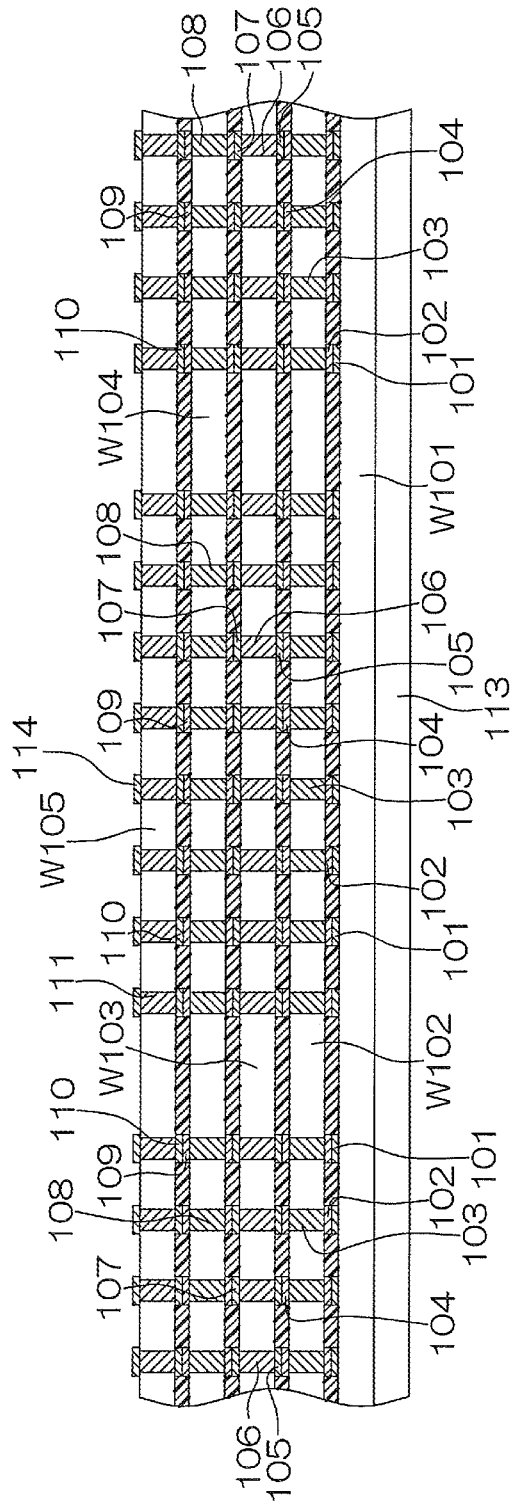
Figure 30:
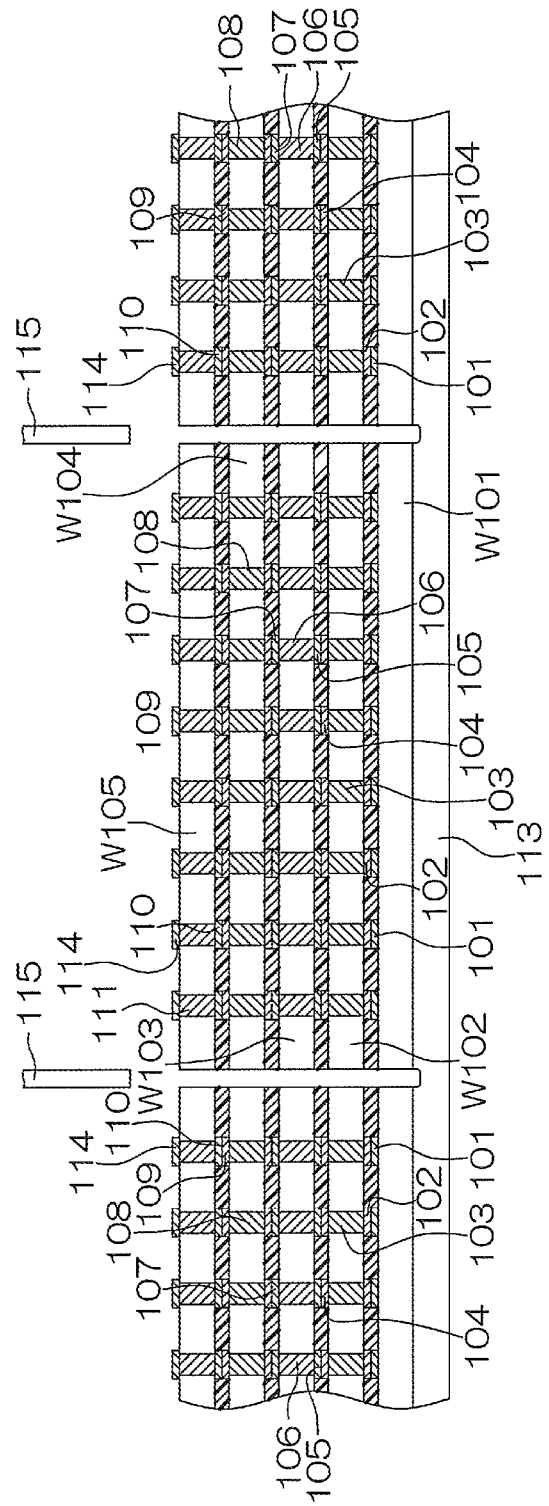

FIGS. 2A to 2Q are schematic sectional views successively showing steps of manufacturing the semiconductor device 1.

First, the surface bumps 5, 6, 9, 12 and 15 are formed on the front surfaces of semiconductor wafers W1 to W5 respectively, as shown in FIG. 2A. The semiconductor wafers W1 to W5 are aggregates of the semiconductor chips C1 to C5 respectively.

Then, grooves G1 to G5 are formed on the front surfaces of the semiconductor wafers W1 to W5 respectively, as shown in FIG. 2B. In the semiconductor wafers W1 to W5, the grooves G1 to G5 are larger in width than dicing lines L set between the semiconductor chips C1 to C5, and extend along the dicing lines L. The depth of the grooves G1 to G5 is set to a value obtained by adding 20 μm to the thickness of the semiconductor chips C1 to C5 completed as the semiconductor device 1. The grooves G1 to G5 can be formed by half cutting with blades 30 larger in thickness than dicing blades 33 (see FIG. 2Q) employed in dicing, for example.

Then, the front surface of the second semiconductor wafer W2 is opposed to the front surface of the first semiconductor wafer W1, as shown in FIG. 2C. After the semiconductor wafers W1 and W2 are relatively registered with each other, the semiconductor wafer W2 is approximated to the semiconductor wafer W1, and the surface bumps 6 of the semiconductor wafer W2 are brought into contact with the surface bumps 5 of the semiconductor wafer W1 respectively. Thus, the semiconductor wafer W2 is supported on the semiconductor wafer W1 with a small interval.

Then, underfill (liquid resin) U is injected into the space between the front surfaces of the semiconductor wafers W1 and W2, as shown in FIG. 2D. The underfill U fills up the space between the semiconductor wafers W1 and W2, and enters the grooves G1 and G2, to also fill up the grooves G1 and G2.

The underfill U may alternatively be applied to the front surface of the semiconductor wafer W1 and/or the front surface of the semiconductor wafer W2 before the semiconductor wafers W1 and W2 are bonded to each other. In this case, the underfill U fills up the space between the semiconductor wafers W1 and W2 as well as the grooves G1 and G2 simultaneously with the bonding of the semiconductor wafer W2 to the semiconductor wafer W1. In other words, steps of bonding the semiconductor wafers W1 and W2 to each other by arranging the same so that the front surfaces thereof are opposed to each other and sealing the space between the semiconductor wafers W1 and W2 with the underfill U are simultaneously carried out in this case.

Then, the rear surface of the semiconductor wafer W2 is polished with a grindstone, and thereafter further polished by CMP (Chemical Mechanical Polishing), as shown in FIG. 2E. The rear surface of the semiconductor wafer W2 is continuously polished until the grooves G2 are exposed on the rear surface of the semiconductor wafer W2 and the depth thereof reaches a prescribed thickness (10 µm, for example). Thus, the thickness of the semiconductor wafer W2 is equalized with that of the semiconductor chip C2 completed as the semiconductor device 1.

After the rear surface of the semiconductor wafer W2 is polished, the through silicon vias 7 passing through the semiconductor wafer W2 in the thickness direction are formed on the same positions as the surface bumps 6 in plan view respectively, as shown in FIG. 2E More specifically, holes passing through the semiconductor wafer W2 are formed on the same positions as the surface bumps 6 in plan view respectively by photolithography and etching. Then, insulating films made of silicon oxide are formed on the inner surfaces of the holes by thermal oxidation or CVD. Thereafter the holes (the inner sides of the insulating films) are filled up with the material for the through silicon vias 7, whereby the through silicon vias 7 are formed to pass through the semiconductor wafer W2 in the thickness direction.

Then, the rear bumps 8 are formed on the through silicon vias 7 respectively, as shown in FIG. 2G More specifically, the rear bumps 8 are obtained by selectively growing the materials for the rear bumps 8 on the through silicon vias 7 respectively by plating and thereafter applying metals meltable by heating to the forward ends of the materials respectively.

Thereafter the front surface of the third semiconductor wafer W3 is opposed to the rear surface of the semiconductor wafer W2, as shown in FIG. 2H. After the semiconductor wafers W2 and W3 are relatively registered with each other, the semiconductor wafer W3 is approximated to the semiconductor wafer W2, and the surface bumps 9 of the semiconductor wafer W3 are brought into contact with the rear bumps 8 of the semiconductor wafer W2 respectively. Thus, the semiconductor wafer W3 is supported on the semiconductor wafer W2 with a small interval. Thereafter underfill U is injected into the space between the rear surface of the semiconductor wafer W2 and the front surface of the semiconductor wafer W3.

The underfill U may alternatively be applied to the rear surface of the semiconductor wafer W2 and/or the front surface of the semiconductor wafer W3 before the semiconductor wafers W2 and W3 are bonded to each other. In this case, the underfill U fills up the space between the semiconductor wafers W2 and W3 simultaneously with the bonding of the semiconductor wafer W3 to the semiconductor wafer W2. In other words, steps of bonding the semiconductor wafers W2 and W3 to each other by arranging the same so that the front surface of the semiconductor wafer W3 is opposed to the rear surface of the semiconductor wafer W2 and sealing the space between the semiconductor wafers W2 and W3 with the underfill U are simultaneously carried out in this case.

Thereafter steps of reducing the thickness of the semiconductor wafer W3 by polishing the rear surface thereof (a step corresponding to that shown in FIG. 2E), forming the through silicon vias 10 in the semiconductor wafer W3 (a step corresponding to that shown in FIG. 2F), forming the rear bumps 11 on the through silicon vias 10 respectively (a step corresponding to that shown in FIG. 2G), bonding the front surface of the fourth semiconductor wafer W4 to the rear surface of the semiconductor wafer W3 (a step corresponding to that shown in FIG. 2H), reducing the thickness of the semiconductor wafer W4 by polishing the rear surface thereof (a step corresponding to that shown in FIG. 2E), forming the through silicon vias 13 in the semiconductor wafer W4 (a step corresponding to that shown in FIG. 2F) and forming the rear bumps 14 on the through silicon vias 13 respectively (a step corresponding to that shown in FIG. 2H) are carried out. As a result, a structure shown in FIG. 2I is obtained.

Then, the front surface of the fifth semiconductor wafer W5 is opposed to the rear surface of the semiconductor wafer W4, as shown in FIG. 2J. After the semiconductor wafers W4 and W5 are relatively registered with each other, the semiconductor wafer W5 is approximated to the semiconductor wafer W4, and the surface bumps 15 of the semiconductor wafer W5 are brought into contact with the rear bumps 14 of the semiconductor wafer W4 respectively. Thus, the semiconductor wafer W5 is supported on the semiconductor wafer W4 with a small interval. Thereafter underfill U is injected into the space between the rear surface of the semiconductor wafer W4 and the front surface of the semiconductor wafer W5.

The underfill U may alternatively be applied to the rear surface of the semiconductor wafer W4 and/or the front surface of the semiconductor wafer W5 before the semiconductor wafers W4 and W5 are bonded to each other. In this case, the underfill U fills up the space between the semiconductor wafers W4 and W5 simultaneously with the bonding of the semiconductor wafer W5 to the semiconductor wafer W4. In other words, steps of bonding the semiconductor wafers W4 and W5 to each other by arranging the same so that the front surface of the semiconductor wafer W5 is opposed to the rear surface of the semiconductor wafer W4 and sealing the space between the semiconductor wafers W4 and W5 with the underfill U are simultaneously carried out in this case.

Then, the rear surface of the semiconductor wafer W5 is polished with a grindstone, and thereafter further polished by CMP, as shown in FIG. 2K. The rear surface of the semiconductor wafer W5 is continuously polished until the grooves G5 are exposed on the rear surface of the semiconductor wafer W5 and the depth thereof reaches a prescribed thickness (10 µm, for example). Thus, the thickness of the semiconductor wafer W5 is equalized with that of the semiconductor chip C5 completed as the semiconductor device 1.

After the rear surface of the semiconductor wafer W5 is polished, the through silicon vias 16 passing through the semiconductor wafer W5 in the thickness direction are formed on the same positions as the surface bumps 15 in plan view respectively through a step similar to that for forming the through silicon vias 7, as shown in FIG. 2L. Thereafter the rear bumps 17 are formed on the through silicon vias 16 respectively through a step similar to that for forming the rear bumps 8.

Thereafter a glass plate 31 is bonded to the rear surface of the semiconductor wafer W5, as shown in FIG. 2M.

Then, the rear surface of the first semiconductor wafer W1 is polished on the basis of the glass plate 31, as shown in FIG. 2N. The rear surface of the semiconductor wafer W1 is continuously polished until the grooves G1 are exposed on the rear surface of the semiconductor wafer W1 and the depth thereof reaches a prescribed thickness (10 µm, for example). Thus, the thickness of the semiconductor wafer W1 is equalized with that of the semiconductor chip C1 completed as the semiconductor device 1.

After the rear surface of the semiconductor wafer W1 is polished, dicing tapes 32 are bonded to the rear surface of the semiconductor wafer W1, as shown in FIG. 2O.

Thereafter the glass plate 31 is removed from the rear surface of the semiconductor wafer W5, as shown in FIG. 2P.

Then, the structure including the semiconductor wafers W1 to W5 is divided by dicing blades 33 having the same width as the dicing lines L as shown in FIG. 2Q, and the semiconductor device 1 shown in FIG. 1 is obtained.

As hereinabove described, the first and second semiconductor wafers W1 and W2 are bonded to each other through the underfill U while the front surfaces thereof are opposed to each other. Thereafter the rear surface of the second semiconductor wafer W2 is polished. Due to the polishing, the underfill U entering the grooves G2 is exposed on the rear surface of the semiconductor wafer W2. Thereafter the through silicon vias 7 passing through the semiconductor wafer W2 in the thickness direction are formed in the semiconductor wafer W2 on the same positions as the surface bumps 6 in plan view. Further, the rear bumps 8 are formed on the through silicon vias 7 exposed on the rear surface of the semiconductor wafer W2. Then, the third semiconductor wafer W3 is arranged on the second semiconductor wafer W2, so that the front surface of the semiconductor wafer W3 is opposed to the rear surface of the semiconductor wafer W2. The underfill U is injected into the space between the semiconductor wafers W2 and W3, and the rear surface of the semiconductor wafer W3 is thereafter polished, whereby the underfill U entering the grooves G3 is exposed on the rear surface of the semiconductor wafer W3. Thereafter the fourth and fifth semiconductor wafers W4 and W5 are stacked through processing similar to that on the third semiconductor wafer W3. After the rear surface of the fifth semiconductor wafer W5 is polished, the rear surface of the first semiconductor wafer W1 is polished. Due to the polishing, the underfill U entering the grooves G1 is exposed on the rear surface of the first semiconductor wafer W1.

Thus, the underfill U entering the grooves G1 and G5 is exposed on the rear surfaces of the first and fifth semiconductor wafers W1 and W5 respectively, and such a structure is obtained that the underfill U passes through the rear surface of the first semiconductor wafer W1 and the rear surface of the fifth semiconductor wafer W5 on the dicing lines L.

In other words, the underfill U forms sealing layers sealing the spaces between the first and fifth semiconductor wafers W1 and W5 and protective members provided on the dicing lines L to pass through the rear surface of the first semiconductor wafer W1 and the rear surface of the fifth semiconductor wafer W5, and a multilayer wafer structure including the first to fifth semiconductor wafers W1 to W5 as well as the sealing layers and the protective members consisting of the underfill U is obtained.

Thereafter the multilayer wafer structure is diced, and the semiconductor device 1 shown in FIG. 1 is obtained.

In the multilayer wafer structure, the protective members (the underfill U) are provided on the dicing lines L, and the protective members on the dicing lines L are cut in the dicing. Thus, the dicing blades 33 employed in the dicing do not come into contact with the semiconductor wafers W1 to W5 (the semiconductor chips C1 to C5), whereby the semiconductor wafers W1 to W5 are not damaged by coming into contact with the dicing blades 33.

In the semiconductor device 1 obtained after the dicing, the overall regions of the side surfaces of the semiconductor chips C1 to C5 are covered with the protective member 22, whereby the semiconductor chips C1 to C5 can be prevented from damages resulting from contact with a hand in handling.

Therefore, corner portions of the semiconductor chips C1 to C5 can be prevented from damages in and after the dicing.

While the embodiment of the present invention has been described, the present invention may be embodied in other ways.

For example, the five semiconductor chips C1 to C5 are stacked on the support substrate 2 in the semiconductor device 1 shown in FIG. 1. However, the number of semiconductor chips stacked on the support substrate 2 is not restricted, so far a plurality of semiconductor chips are stacked. In other words, the minimum structure to which the present invention is applicable is obtained by stacking the first and second semiconductor chips C1 and C2 on the support substrate 2.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

What is claimed is:

1. A method of manufacturing a semiconductor device, comprising:
    a groove forming step of forming grooves on respective front surfaces of first and second semiconductor wafers each including an aggregate of a plurality of semiconductor chips, such that the grooves each extend on a dicing line set between the semiconductor chips and to have a larger width than the dicing line;
    an arranging step of arranging the first and second semiconductor wafers so that the front surfaces thereof are opposed to each other after the groove forming step;
    a sealing step of sealing a space between the first semiconductor wafer and the second semiconductor wafer with underfill;
    a polishing step of polishing respective rear surfaces of the first and second semiconductor wafers until at least the grooves are exposed after the arranging step and the sealing step; and
    a dicing step of cutting a structure including the first and second semiconductor wafers and the underfill on the dicing line after the polishing step.

2. The method of manufacturing a semiconductor device according to claim 1, wherein
    a depth of the grooves is set to a value obtained by adding 20 µm to a thickness of the first and second semiconductor wafers after the polishing step.

3. The method of manufacturing a semiconductor device according to claim 1, wherein
    surface bumps are formed on the front surfaces of the first and second semiconductor wafers respectively, and
    the surface bump of the first semiconductor wafer and the surface bump of the second semiconductor wafer are brought into contact with each other in the arranging step.

4. The method of manufacturing a semiconductor device according to claim 3, wherein
    the polishing step includes the steps of polishing the rear surface of the first semiconductor wafer and polishing the rear surface of the second semiconductor wafer, and
    the method of manufacturing a semiconductor device further comprises:
    a via forming step of forming a through via passing through the second semiconductor wafer in a thickness direction in the second semiconductor wafer on the same position as the surface bump in plan view after termination of the polishing of the rear surface of the second semiconductor wafer and before starting of the polishing of the rear surface of the first semiconductor wafer; and a rear bump forming step of forming a rear bump on the through via exposed on the rear surface of the second semiconductor wafer.

5. The method of manufacturing a semiconductor device according to claim 4, wherein a surface bump is formed on a front surface of a third semiconductor wafer including an aggregate of a plurality of semiconductor chips, and the method of manufacturing a semiconductor device further comprises:

a second groove forming step of forming a groove having a larger width than a dicing line set between the semiconductor chips on the front surface of the third semiconductor wafer along the dicing line;

a second arranging step of arranging the third semiconductor wafer on the second semiconductor wafer so that the front surface of the third semiconductor wafer is opposed to the rear surface of the second semiconductor wafer and bringing the surface bump of the third semiconductor wafer into contact with the rear bump of the second semiconductor wafer;

a second sealing step of sealing a space between the second semiconductor wafer and the third semiconductor wafer with underfill; and a second polishing step of polishing the rear surface of the third semiconductor wafer until at least the groove is exposed after the second arranging step and the second sealing step.

* * * * *